United States Patent
Choong

(10) Patent No.: US 10,490,164 B2
(45) Date of Patent: Nov. 26, 2019

(54) STRETCHABLE DISPLAY WITH FIXED PIXEL DENSITY

(71) Applicant: Intel Corporation, Santa Clara, CA (US)

(72) Inventor: Chwee Lin Choong, Paya Terubung (MY)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/156,885

(22) Filed: Oct. 10, 2018

(65) Prior Publication Data

US 2019/0043454 A1 Feb. 7, 2019

(51) Int. Cl.
*G09G 5/00* (2006.01)
*G09G 5/14* (2006.01)
(Continued)

(52) U.S. Cl.
CPC ............ *G09G 5/14* (2013.01); *G09G 3/3208* (2013.01); *H01L 25/048* (2013.01); *H01L 27/3216* (2013.01); *H01L 27/3218* (2013.01); *H01L 27/3225* (2013.01); *H01L 27/3276* (2013.01); *H01L 51/0097* (2013.01); *H01L 51/5253* (2013.01); *H01L 51/56* (2013.01); *G09G 2340/0407* (2013.01); *G09G 2380/02* (2013.01); *H01L 2251/5338* (2013.01)

(58) Field of Classification Search
None
See application file for complete search history.

(56) References Cited

U.S. PATENT DOCUMENTS

2015/0091785 A1* 4/2015 Lee ...................... G09G 3/3208
345/77
2019/0035861 A1* 1/2019 Wang ..................... H01L 27/12

FOREIGN PATENT DOCUMENTS

WO 20150140785 A1 9/2015

OTHER PUBLICATIONS

Wang & Lee, Progress and Prospects in Stretchable Electroluminescent Devices, Nanophotonics 6, 435-451 (2017), 17 pages.
(Continued)

*Primary Examiner* — Martin Mushambo
(74) *Attorney, Agent, or Firm* — Grossman, Tucker, Perreault & Pfleger, PLLC

(57) ABSTRACT

The present disclosure is directed to systems and methods of forming an expandable display device capable of maintaining a fixed pixel density at any display area from a relatively smaller first display area to a relatively larger second display area. The expandable display device includes an upper display layer and a lower display layer. In a first display position, the display elements having a defined pixel density included in the upper display layer obscure the display elements included in the lower display layer. The upper display layer and lower display layers are disposed on expandable substrates capable of continuous displacement between the first and second display positions. In the second display position, the display elements included in the lower display layer are visible through gaps between the display elements included in the upper display layer. The resultant display provides a uniform pixel density at all displacements between the first and second display positions.

25 Claims, 17 Drawing Sheets

(51) Int. Cl.
  *H01L 51/00*  (2006.01)
  *H01L 27/32*  (2006.01)
  *H01L 51/52*  (2006.01)
  *H01L 51/56*  (2006.01)
  *G09G 3/3208*  (2016.01)
  *H01L 25/04*  (2014.01)

(56) References Cited

OTHER PUBLICATIONS

Kim et al., Stretchable, Transparent Graphene Interconnects for Arrays of Microscale Inorganic Light Emitting Diodes on Rubber Substrates, Nano Lett. 9, 3881-3886 (2011), 6 pages.

Liang et al., Elastomeric Polymer Light-Emitting Devices and Displays, Nat. Photon. 7, 817-824 (2013), 8 pages.

Ganesh et al., Stretchable Light-Emitting Diodes with Organometal-Halide-Perovskite-Polymer Composite Emitters, Adv. Mater. 29, 1607053-9 (2017), 7 pages.

Ren et al., Design and Characterisation of a Tuneable 3D Buckling-Induced Auxetic Metamaterial, Mater. Design 139, 336-342 (2018), 7 pages.

Tang et al., Design of Hierarchically Cut Hinges for Highly Stretchable and Recontigurable Metamaterials with Enhanced Strength, Adv. Mater. 27, 7181-7190 (2015), 10 pages.

Yan et al., Highly Stretchable and Shape-Controllable Three-Dimensional Antenna Fabricated by "Cut-Transfer-Release" Method, Sci. Rep. 7, 42227 (2017), 7 pages.

Rogers, et al., Materials and Mechanics for Stretchable Electronics, Science, 327, 1603-1606 (2010).

\* cited by examiner

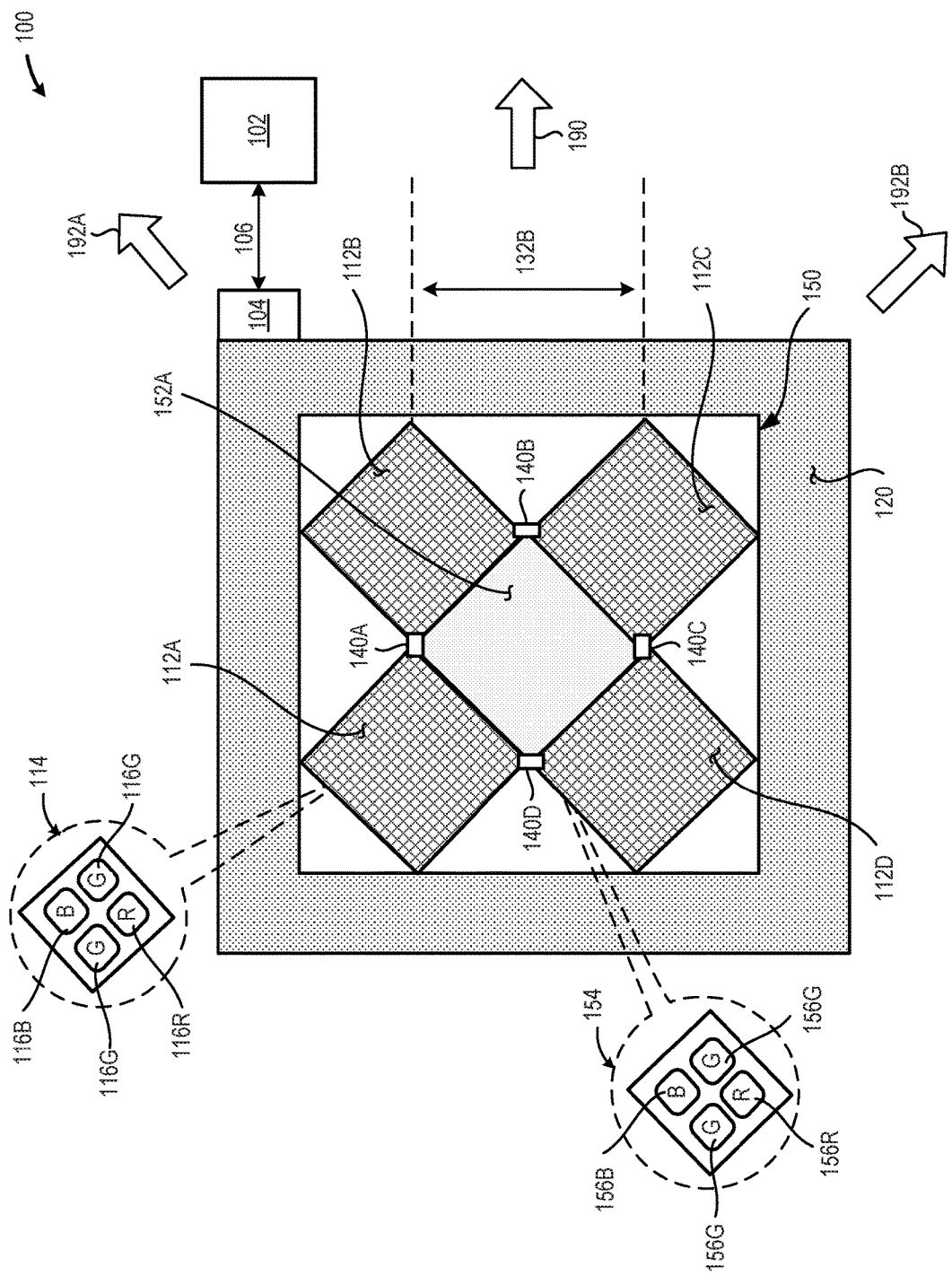
FIG. 1C (UPPER LAYER + LOW LAYER)

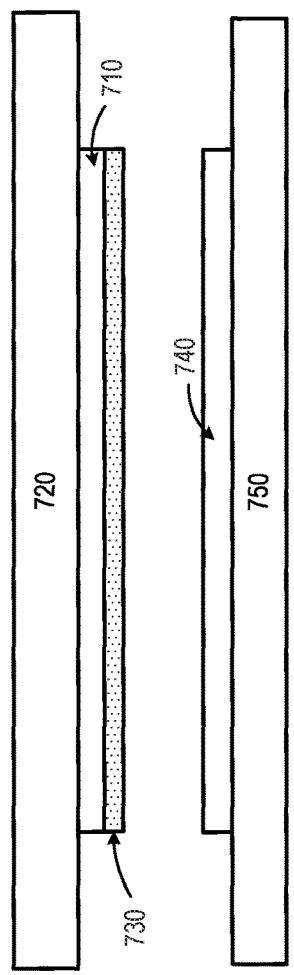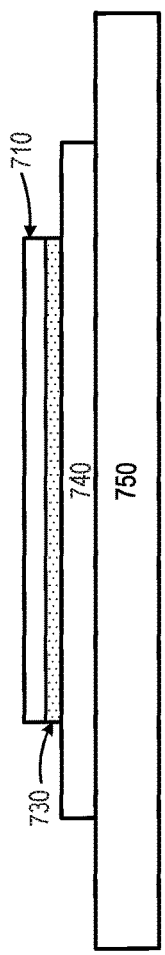
FIG. 7C
FIG. 7D

STRETCHABLE DISPLAY WITH FIXED PIXEL DENSITY

TECHNICAL FIELD

The present disclosure relates to display devices, more specifically to display devices featuring a variable display area.

BACKGROUND

Electronic devices are, with greater frequency, expected to increase in computational versatility while maintaining as small a form factor as possible. Unfortunately, the size limitations imposed by small form factor design, often result in a compromised fixed format display size. As the versatility of portable devices increases, the relatively small display size serves to functionally limit the usefulness (and consequently, acceptance) of small form factor devices.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

FIG. 1C is a plan view of the illustrative expandable display device depicting the upper layer shown in FIG. 1A stacked above the lower layer shown in FIG. 1B after the application of a force applied along two orthogonal axes, in accordance with at least one embodiment described herein;

FIG. 7C is an elevation depicting the detachable attachment or detachable affixing of a pre-strained (i.e., extended or displaced to the second display position) expandable substrate to an illustrative second rigid carrier member, in accordance with at least one embodiment described herein;

FIG. 7D is an elevation depicting the attachment or affixing of the back side of the display element to the pre-strained (i.e., extended or displaced to the second display position) expandable substrate, in accordance with at least one embodiment described herein;

Figure 1A:
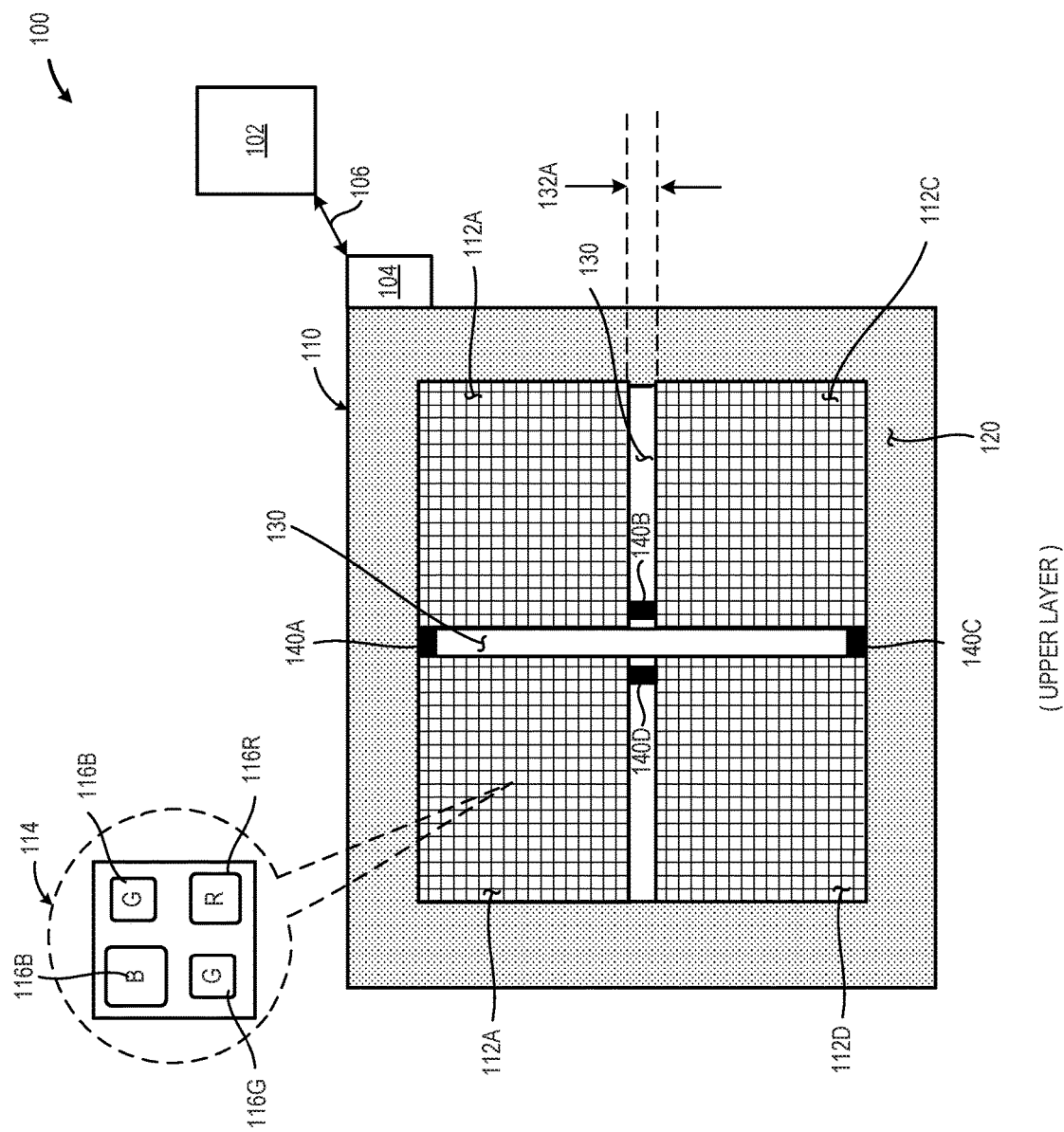
FIG. 1A is a plan view of an illustrative expandable display device depicting an illustrative upper layer incorporating a plurality of upper display elements disposed on an upper expandable substrate, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems and methods described herein advantageously provide an expandable or stretchable display device capable of displacement along a single axis or along multiple axes while beneficially retaining a fixed pixel density. Thus, the systems and methods described herein overcome the reduced resolution of prior expandable or stretchable display devices. The ability to maintain a fixed pixel density as a display device continuously transitions from a first display position to a second display position represents a significant advantage, particularly when executing an application that benefits from high resolution graphics.

The systems and methods described herein include a display device having a positionable, expandable, and continuously displaceable upper layer positioned above a positionable, expandable, and continuously displaceable lower layer. The upper layer includes a first plurality of display elements affixed to an expandable or stretchable substrate. Each of the display elements included in the first plurality of display elements has a defined physical geometry that includes a matrix formed using any number of pixels. The lower layer includes a second plurality of display elements affixed to an expandable or stretchable substrate. Each of the display elements included in the second plurality of display elements has a defined physical geometry that includes a matrix formed using any number of pixels.

The each of the first plurality of display elements are conductively coupled to at least one other of the display elements in the first plurality of display elements. Similarly, each of the second plurality of display elements are conductively coupled to at least one other of the display elements in the second plurality of display elements. As the display device is expanded or stretched, the display elements included in the first plurality of display elements separate, revealing an increasing portion of each of the display elements included in the underlying second plurality of display elements. Beneficially, the pixel density of the display remains constant at any point from a first position where the display elements included in the second plurality of display elements are obscured to a second position where the display elements included in the second plurality of display elements are completely exposed.

By way of illustrative example—assume the upper layer includes four 1 cm by 1 cm square display elements, each measuring 6 pixels by 6 pixels—the upper layer thus forms a 2 cm by 2 cm, 12 pixel by 12 pixel, display area; the lower layer also includes four 1 cm by 1 cm square display elements, each measuring 6 pixels by 6 pixels (6 pixels/cm)—the lower layer thus forms a 2 cm by 2 cm, 12 pixel by 12 pixel, display area that is disposed beneath the upper layer. As the display is stretched, a portion of each of the display elements on the lower layer are exposed. Control circuitry monitors the position of the upper display elements and the lower display elements to maintain image continuity as the display is expanded or stretched. When fully stretched along both the x-axis and the y-axis, the display elements on the lower layer are completely exposed. When fully stretched, the display measures 4 cm by 4 cm and has a resolution of 24 pixels by 24 pixels (6 pixels/cm). Advantageously, using the systems and methods described herein, the pixel density (and consequently, image quality) remains consistent continuously throughout the expansion process.

A variable viewing area display device continuously displaceable between a first display position that provides a first display area and a second display position that provides a second display area, the second display area larger than the first display area is provided. The display device may include: an upper display layer that includes a plurality of upper display elements disposed on an expandable substrate, the expandable substrate continuously displaceable between the first display position and the second display position; a lower display layer that includes a plurality of lower display elements disposed on an expandable substrate, the expandable substrate continuously displaceable between the first display position and the second display position wherein: in the first display position the plurality of upper display elements obscure at least a portion of the plurality of lower display elements; as the display device is displaced from the first position to the second position, at least a portion of each of the plurality of lower display elements are visible through void spaces formed in the expandable substrate of the upper display layer between each of at least some of the plurality of upper display elements; and in the second position each of the plurality of lower display elements are visible through the void spaces formed in the expandable substrate of the upper display layer between each of at least some of the plurality of upper display elements.

A variable area display method is provided. The method may include: receiving, by expandable display control circuitry, a signal that includes information indicative of a relative position of an upper display layer with respect to a lower display layer; identifying, by the expandable display control circuitry, an exposed portion of each of a plurality of lower display elements based on the relative position of the upper display layer with respect to the lower display layer; determining, by the expandable display control circuitry, a first portion of a display image for display using a plurality of upper display elements included in the upper display layer; and determining, by the expandable display control circuitry, a second portion of a display image for display using the identified exposed portion of each of the lower display elements such that a display image having a uniform pixel density is maintained.

Another variable area display method is provided. The method may include: pre-straining an upper expandable substrate having an upper surface and a lower expandable substrate having an upper surface; affixing a rear surface of each of a plurality of upper display elements to the upper surface of the upper expandable substrate; each of the plurality of upper display elements spaced apart from at least one other of the plurality of upper display elements to form interstitial spaces separating each of the plurality of upper display elements from each other on the upper expandable substrate; affixing a rear surface each of a plurality of lower display elements to the upper surface of the lower expandable substrate; each of the plurality of lower display elements spaced apart from at least one other of the plurality of lower display elements to form interstitial spaces separating each of the plurality of lower display elements from each other on the lower expandable substrate; removing portions of the upper expandable substrate in the interstitial spaces that separate the plurality of upper display elements; stacking the pre-strained upper expandable substrate on the pre-strained lower expandable substrate; and releasing the strain on the upper expandable substrate and the strain on the lower expandable substrate.

Another variable area display system is provided. The system may include: means for receiving a signal that includes information indicative of a relative position of an upper display layer with respect to a lower display layer; means for identifying an exposed portion of each of a plurality of lower display elements based on the relative position of the upper display layer with respect to the lower display layer; means for determining a first portion of a display image for display using a plurality of upper display elements included in the upper display layer; and means for determining a second portion of a display image for display using the identified exposed portion of each of the lower display elements such that a display image having a uniform pixel density is maintained.

A non-transitory machine-readable storage medium that includes instructions is provided. The instructions, when executed by expandable display control circuitry, cause the expandable display control circuitry to: receive a signal that includes information indicative of a relative position of an upper display layer with respect to a lower display layer; identify an exposed portion of each of a plurality of lower display elements based on the relative position of the upper display layer with respect to the lower display layer; determine a first portion of a display image for display using a plurality of upper display elements included in the upper display layer; and determine a second portion of a display image for display using the identified exposed portion of each of the lower display elements such that a display image having a uniform pixel density is maintained.

An electronic device is provided. The electronic device may include: a printed circuit board; processor circuitry; input/output (I/O) circuitry; and a variable viewing area display device continuously displaceable between a first display position that provides a first display area and a second display position that provides a second display area, the second display area larger than the first display area, the variable viewing area display device comprising: an upper display layer that includes a plurality of upper display elements disposed on an expandable substrate, the expandable substrate continuously displaceable between the first display position and the second display position; a lower display layer that includes a plurality of lower display elements disposed on an expandable substrate, the expandable substrate continuously displaceable between the first display position and the second display position wherein: in the first display position the plurality of upper display elements obscure at least a portion of the plurality of lower display elements; as the display device is displaced from the first position to the second position, at least a portion of each of the plurality of lower display elements are visible through void spaces formed in the expandable substrate of the upper display layer between each of at least some of the plurality of upper display elements; and in the second position each of the plurality of lower display elements are visible through the void spaces formed in the expandable substrate of the upper display layer between each of at least some of the plurality of upper display elements.

FIG. 1A is a plan view of an illustrative expandable display device 100 depicting an illustrative upper layer 110 incorporating a plurality of upper display elements 112A-112n (collectively—"upper display elements 112"—four such upper display elements, 112A-112D, are shown in FIG. 1A) disposed on an upper expandable substrate 120, in accordance with at least one embodiment described herein. As depicted in FIG. 1A, a gap 130, with spacing 132, exists between each of the plurality of upper display elements 112. The each of the upper display elements 112 is conductively coupled to a neighboring upper layer display element 112 by one or more conductive couplings 140A-140n (collectively, "conductive couplings 140"—four such conductive couplings 140A-140D, are shown in FIG. 1A).

Figure 1B:
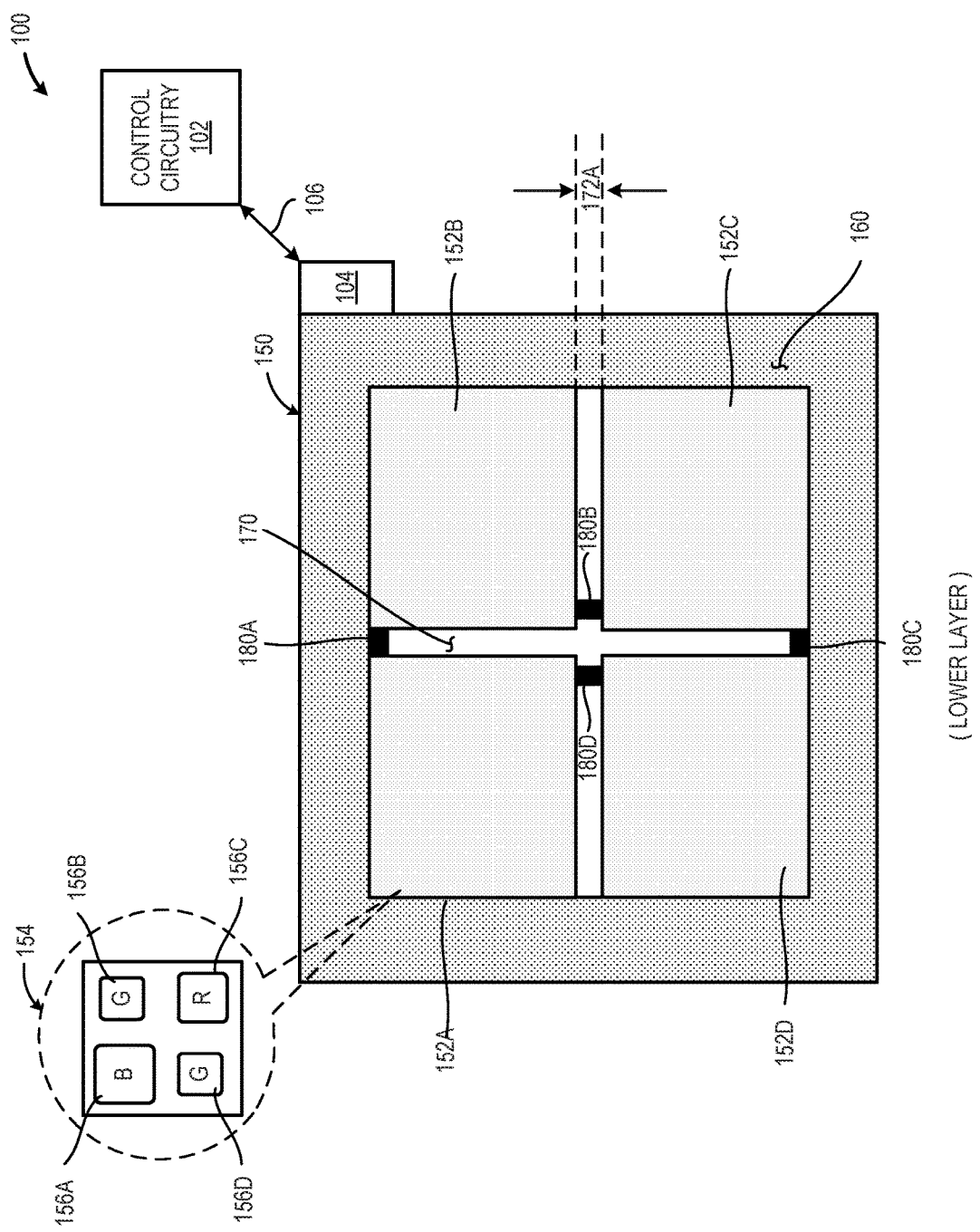
FIG. 1B is a plan view of the illustrative expandable display device depicting an illustrative lower layer incorporating a plurality of lower display elements disposed on a lower expandable substrate, in accordance with at least one embodiment described herein.

FIG. 1B is a plan view of the illustrative expandable display device 100 depicting an illustrative lower layer 150 incorporating a plurality of lower display elements 152A-152n (collectively—"lower display elements 152"—four such lower display elements, 152A-152D, are shown in FIG. 1B) disposed on a lower expandable substrate 160, in accordance with at least one embodiment described herein.

As depicted in FIG. 1B, a gap 170, with spacing 172, exists between each of the plurality of lower display elements 152. The each of the upper display elements 152 is conductively coupled to a neighboring upper layer display element 152 by one or more conductive couplings 180A-180n (collectively, "conductive couplings 180"—four such conductive couplings 180A-180D, are shown in FIG. 1B). In embodiments, the upper display elements 112 and the lower display elements 152 are staggered such that the gaps 130 between upper display elements 112 and the gaps 170 between lower display elements 152 are not in vertical alignment and the actual upper display elements 112 are not in vertical alignment with the lower display elements 152.

FIG. 1C is a plan view of the illustrative expandable display device 100 depicting the upper layer 110 shown in FIG. 1A stacked above the lower layer 150 shown in FIG. 1B after the application of a force 190 applied along two orthogonal axes 190A and 190B, in accordance with at least one embodiment described herein. As depicted in FIG. 1C, the upper display elements 112 may be displaced from a first display position (FIG. 1A—in which the lower display elements 152 are partially or completely obscured) to a second display position (FIG. 1C—in which the upper display elements 112 are spaced apart a second distance 132B in which the lower display elements 152 are partially or completely exposed).

In embodiments, the upper display elements 112 includes any number of pixels arranged in any geometric shape. Thus, although the upper display elements 112 are depicted as square-shaped in FIG. 1A, in other embodiments, the upper display elements 112 may have a circular, oval, polygonal, rectangular, or similar geometric shape. Each of the upper display elements may include an upper surface that forms the visible image portion of the display device and a rear surface that includes various electrical circuits and semiconductor components used to activate the pixels forming the upper display element 112. In embodiments, the upper display elements 112 may include a plurality of red pixels 116R, green pixels 116G, and blue pixels 116B disposed to form a Bayer filter pattern 154. In embodiments, the pixels forming the upper display elements 112 are arranged to form a single or repeating pattern. In other embodiments, the pixels forming the upper display elements 112 are distributed randomly or pseudo-randomly across the surface of the upper layer display element 112. In embodiments, the upper display elements 112 are square shaped and include a pixel matrix that of 4 pixels high by 4 pixels wide (4 pixels×4 pixels) or higher; 8 pixels×8 pixels or higher; 12 pixels by 12 pixels or higher; 16 pixels by 16 pixels or higher 32 pixels by 32 pixels or higher; 64 pixels by 64 pixels or higher; or 128 pixels by 128 pixels or higher. The upper display elements 112 may include any number and/or combination of currently available or future developed active (i.e., emissive) pixel technology, including but not limited to: light emitting diodes (LEDs); organic LEDs (OLEDs); polymer LEDs (PLEDs); or combinations thereof.

The upper display elements 112 are disposed in, on, about, or across all or a portion of the expandable substrate 120. The expandable substrate 120 may include one or more materials capable of continuous expansion from a first display position that provides a first display area to a second display position that provides a second display area. The expandable substrate may include one or more polymers or elastomers capable of expansion along one axis (e.g., display diagonal, height, or width) or expansion along two orthogonal axes (e.g., display device height and width). The interstitial expandable substrate 120 between the upper display elements 112 is removed such that when the expandable substrate 120 is displaced from the first display position voids or gaps form in the expandable substrate 120. All or a portion of each of the lower display elements 152 are visible through the voids or gaps as the expandable substrate 120 is displaced from the first display position to the second display position. In embodiments, when the upper layer 110 is disposed in the second display position, each of the plurality of lower display elements 152 are visible through a gap or void in the expandable substrate 120. In embodiments, the expandable substrate 120 is biased towards the first display position. In such embodiments, one or more tensioning devices may maintain the expandable substrate 120 in an expanded position between the first display position and the second display position.

In embodiments, the expandable substrate 120 has a uniform composition throughout and each of the plurality of upper display elements 112 may be affixed directly to the expandable substrate using one or more bonding systems or methods (adhesive, thermosetting resin, etc.). In other embodiments, the expandable substrate 120 may be formed or otherwise disposed partially or completely about rigid members (e.g., rigid "islands" disposed in an expandable or elastomeric material) such that application of force 190 causes an elongation of the expandable substrate 120 but not the rigid members disposed within the expandable substrate 120. In such embodiments, the upper display elements 112 are physically and/or chemically affixed, bonded, or otherwise attached to the rigid members disposed in, on, or about the expandable substrate 120.

Each of the plurality of upper display elements 112 is spaced apart from the remaining upper display elements 112 by gap 130. In the first display position, the gap 130 between the upper display elements 112 may have a first dimension 132A. In the first display position, the void or gap in the expandable substrate 120 may have the first dimension 132A. In the second display position, the gap 130 between the upper display elements may have a second dimension 132B that is larger than the first dimension 132A. In the second display position, the void or gap in the expandable substrate 120 may have the second dimension 132B.

One or more flexible conductors 140 couple each of the plurality of upper display elements 112 to one or more other of the upper display elements 112. The flexible conductors 140 include any number of conductive pathways or traces and may provide communication between each of the upper display elements 112 and expandable display control circuitry 102 that cause the upper display elements 112 and lower display elements 152 to display a coherent image when the display is positioned at the first display position, the second display position, or any location between the first display position and the second display position. In embodiments, the system 100 includes one or more sensors 104 that provide one or more position signals 106 that contain information and/or data indicative of the position of the upper layer 110 with respect to the lower layer 150. The expandable display control circuitry 102 uses the information and/or data included in the one or more position signals 106 to determine the content provided by the upper display elements 112. The expandable display control circuitry 102 uses the information and/or data included in the one or more position signals 106 to determine the percentage of pixels included in the lower display elements 152 to energize based on the portion of the lower display elements 152 exposed by the position of the upper layer 110 with respect to the lower layer 150.

The expandable display control circuitry 102 includes any number and/or combination of currently available and/or future developed electrical components, semiconductor devices, and/or logic elements capable of determining the relative position of the upper layer 110 with respect to the lower layer 150 and adjusting the display output of the pixels included on the lower display elements 150 to maintain image coherency with the display device positioned at any point between the first display position and the second display position. In embodiments, the expandable display control circuitry 102 may determine the portion of the lower display elements 152 exposed by the displacement of the upper layer 110 and may determine the illumination level and content of the pixels included in the respective lower display elements 152 such that image displayed by the display device 100 remains coherent.

The one or more sensors 104 include any number and/or combination of currently available and/or future developed sensing elements, electrical components, and/or semiconductor devices capable of producing the one or more output signals 106 that include information and/or data indicative of a position of the upper layer 110 with respect to the lower layer 150. Example sensors 104 include, but are not limited to one or more: proximity sensors, ultrasonic sensors, LIDAR sensors, strain sensors, stretch sensors, or combinations thereof.

In embodiments, each of the lower display elements 152 include any number of pixels arranged in any geometric shape. In embodiments, the geometric shape of the lower display elements 152 may be similar to or the same as the geometric shape of the upper display elements 112. Thus, although the lower display elements 152 are depicted as square-shaped in FIG. 1B, in other embodiments, the lower display elements 152 may have a circular, oval, polygonal, rectangular, or similar geometric shape. Each of the lower display elements 152 may include an front or upper surface that forms the visible image portion of the display device and a rear or lower surface that includes various electrical circuits and semiconductor components used to activate the pixels forming and/or included in the lower layer display element 152. In embodiments, the lower display elements 152 may include a plurality of red pixels 156R, a plurality of green pixels 156G, and a plurality of blue pixels 156B disposed to form a Bayer filter pattern 154. In embodiments, the pixels forming the lower display elements 152 are arranged to form a single or repeating pattern. In other embodiments, the pixels forming the lower display elements 152 are distributed randomly or pseudo-randomly across the surface of the lower layer display element 152. In embodiments, each of the lower display elements 152 are square shaped and include a pixel matrix that of 4 pixels high by 4 pixels wide (4 pixels×4 pixels) or higher; 8 pixels×8 pixels or higher; 12 pixels by 12 pixels or higher; 16 pixels by 16 pixels or higher 32 pixels by 32 pixels or higher; 64 pixels by 64 pixels or higher; or 128 pixels by 128 pixels or higher. The lower display elements 152 may include any number and/or combination of currently available or future developed active (i.e., emissive) pixel technology, including but not limited to: light emitting diodes (LEDs); organic LEDs (OLEDs); polymer LEDs (PLEDs); or combinations thereof.

The lower display elements 152 are disposed in, on, about, or across all or a portion of the expandable substrate 160. The expandable substrate 160 may include one or more materials capable of continuous expansion from a first display position that provides a first display area to a second display position that provides a second display area. The expandable substrate 160 may include one or more polymers or elastomers capable of expansion along one axis (e.g., display diagonal, height, or width) or expansion along two orthogonal axes (e.g., display device height and width). All or a portion of each of the lower display elements 152 are visible through the voids or gaps as the expandable substrate 120 is displaced from the first display position to the second display position. In embodiments, when the upper layer 110 is disposed in the second display position, at least a portion of each of the plurality of lower display elements 152 are visible through a gap or void in the expandable substrate 120 supporting the upper layer 110. In embodiments, the expandable substrate 160 is biased towards the first display position. In such embodiments, one or more tensioning devices may maintain the expandable substrate 160 in an expanded position between the first display position and the second display position.

In embodiments, the expandable substrate 160 has a uniform composition throughout and each of the plurality of lower display elements 152 may be affixed directly to the expandable substrate 160 using one or more bonding systems or methods (adhesive, thermosetting resin, etc.). In other embodiments, the expandable substrate 160 may be formed or otherwise disposed partially or completely about rigid members (e.g., rigid "islands" disposed in an expandable or elastomeric material) such that application of force 190 causes an elongation of the expandable substrate 160 but not the rigid members supporting the lower display elements 152 disposed within the expandable substrate 160. In such embodiments, the lower display elements 152 are physically and/or chemically affixed, bonded, or otherwise attached to the rigid members disposed in, on, or about the expandable substrate 160. Each of the plurality of lower display elements 152 is spaced apart from the remaining lower display elements 152 by gap 170. In the first display position, the gap 170 between the lower display elements 152 may have a first dimension 172A.

One or more flexible conductors 180 couple each of the plurality of lower display elements 152 to one or more other of the other lower display elements 152. The flexible conductors 180 include any number of conductive pathways or traces and may provide communication between each of the lower display elements 152 and expandable display control circuitry 102 that cause the lower display elements 152 and upper display elements 112 to display a coherent image when the display is positioned at the first display position, the second display position, or any location between the first display position and the second display position. In embodiments, the system 100 includes one or more sensors 104 that provide one or more position signals 106 that contain information and/or data indicative of the position of the upper layer 110 with respect to the lower layer 150. The expandable display control circuitry 102 uses the information and/or data included in the one or more position signals 106 to determine the content provided by the upper display elements 112. The expandable display control circuitry 102 uses the information and/or data included in the one or more position signals 106 to determine the percentage of pixels included in the lower display elements 152 to energize based on the portion of the lower display elements 152 exposed by the position of the upper layer 110 with respect to the lower layer 150. Beneficially, the display device 100 maintains a constant pixel density throughout the range of display area from the first display area to the second display area.

In operation, in the first display position, the upper display elements 112 provide a relative small display area having a defined pixel density. For example, in the first display position, the upper display elements 112 may provide a display device having a pixel density of: greater than about 50 pixels per inch (ppi); greater than about 100 ppi; greater than about 200 ppi; greater than about 300 ppi; greater than about 400 ppi; or greater than about 500 ppi. In the second display position the upper display elements 112 are displaced a distance sufficient to expose some or all of the lower display elements 152 yielding a display device 100 in which both the upper display elements 112 and the lower display elements 152 are visible. When in the second display position, the combined upper display elements 112 and lower display elements 152 provide a relatively large display area having the same defined pixel density as the relatively smaller display area provided by the upper display elements 112 alone. Thus, in the second display position, the upper display elements 112 may provide a display device having a pixel density of: greater than about 50 ppi; greater than about 100 ppi; greater than about 200 ppi; greater than about 300 ppi; greater than about 400 ppi; or greater than about 500 ppi.

Figure 2A:
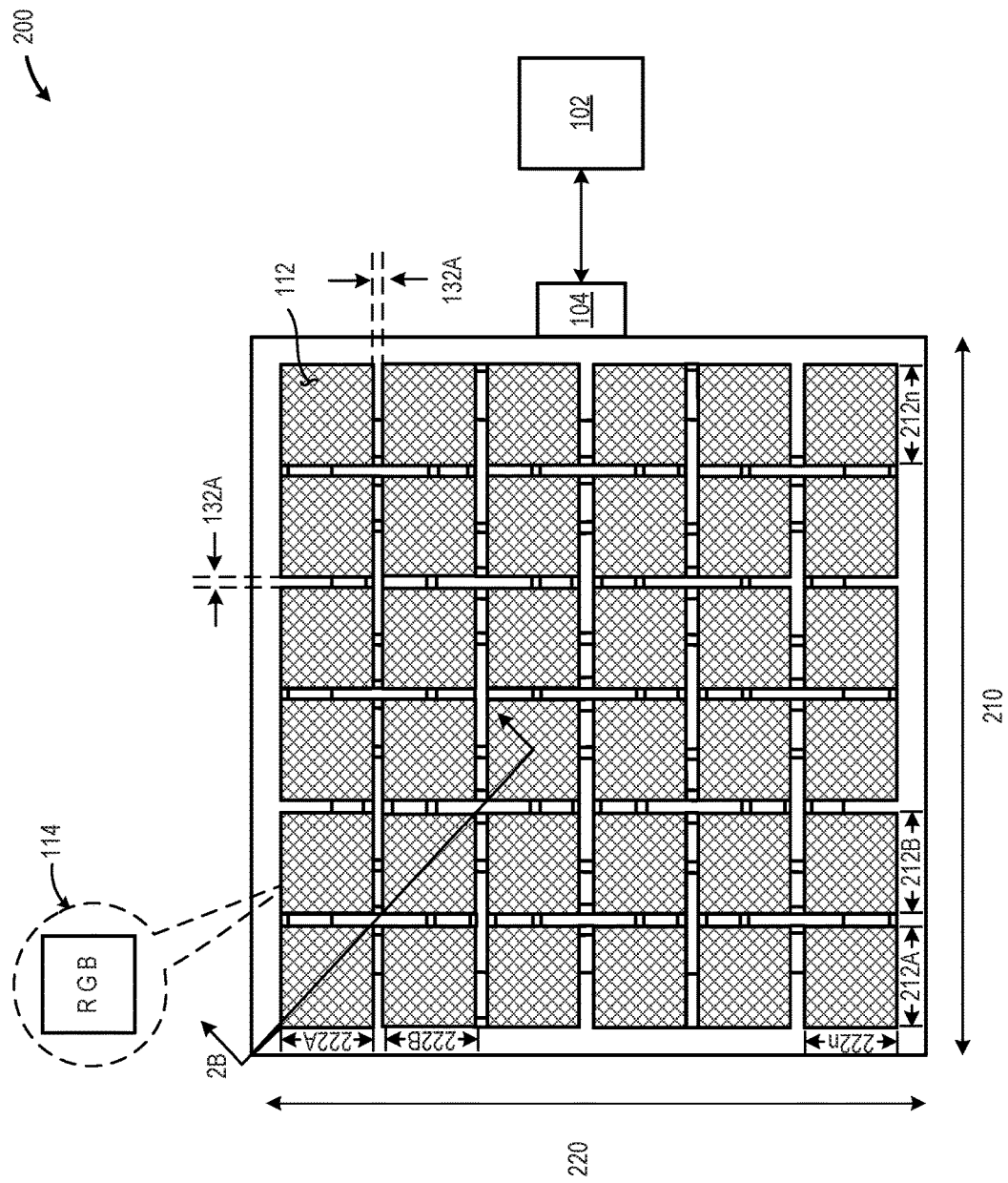
FIG. 2A is a plan view of an illustrative expandable display device having a first display area that includes 6×6 upper display element matrix, in accordance with at least one embodiment described herein.
Figure 2B:
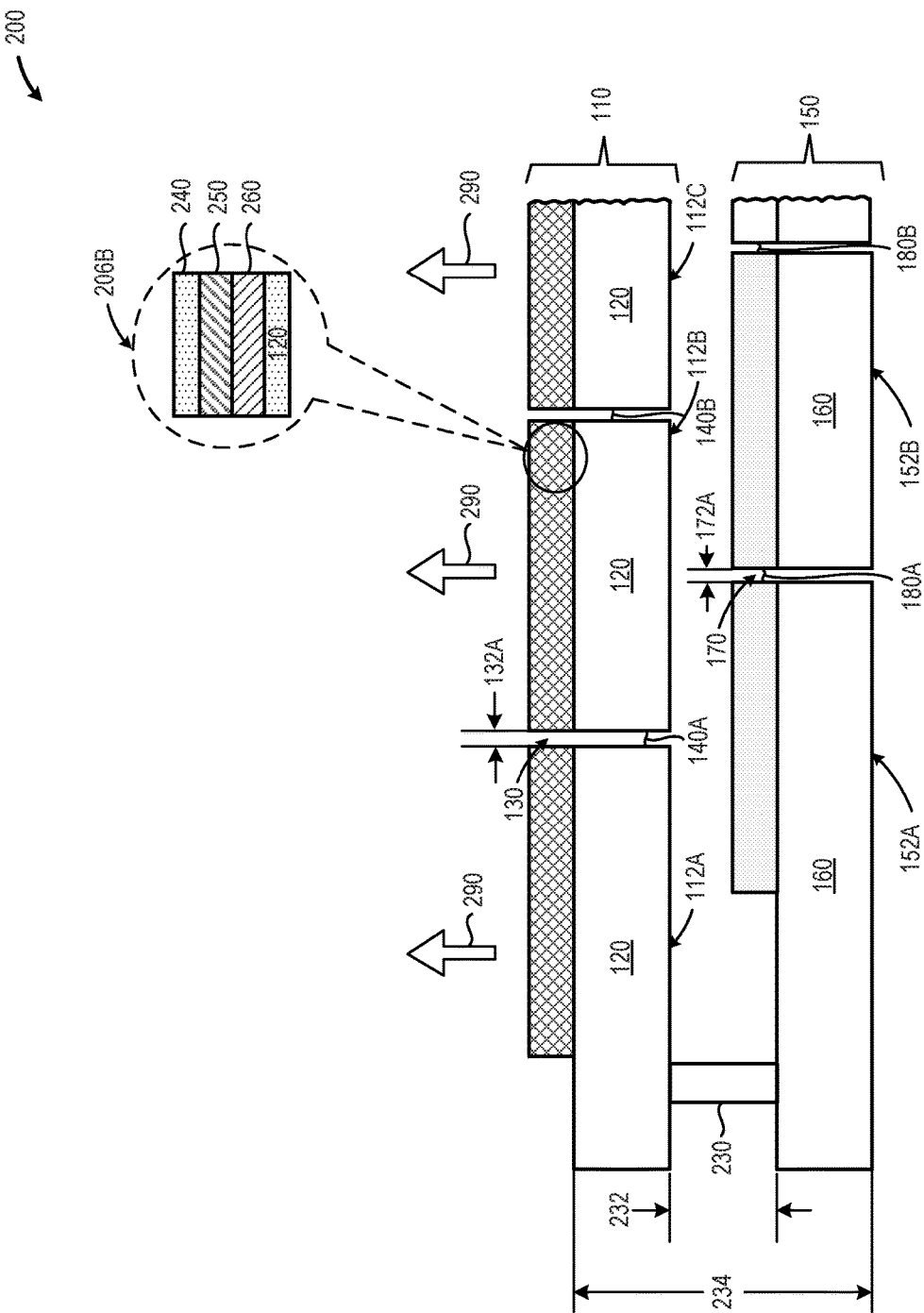
FIG. 2B is a partial cross-sectional view of the illustrative expandable display device depicted in FIG. 2A, along sectional line 2B-2B, in accordance with at least one embodiment described herein.
Figure 2C:
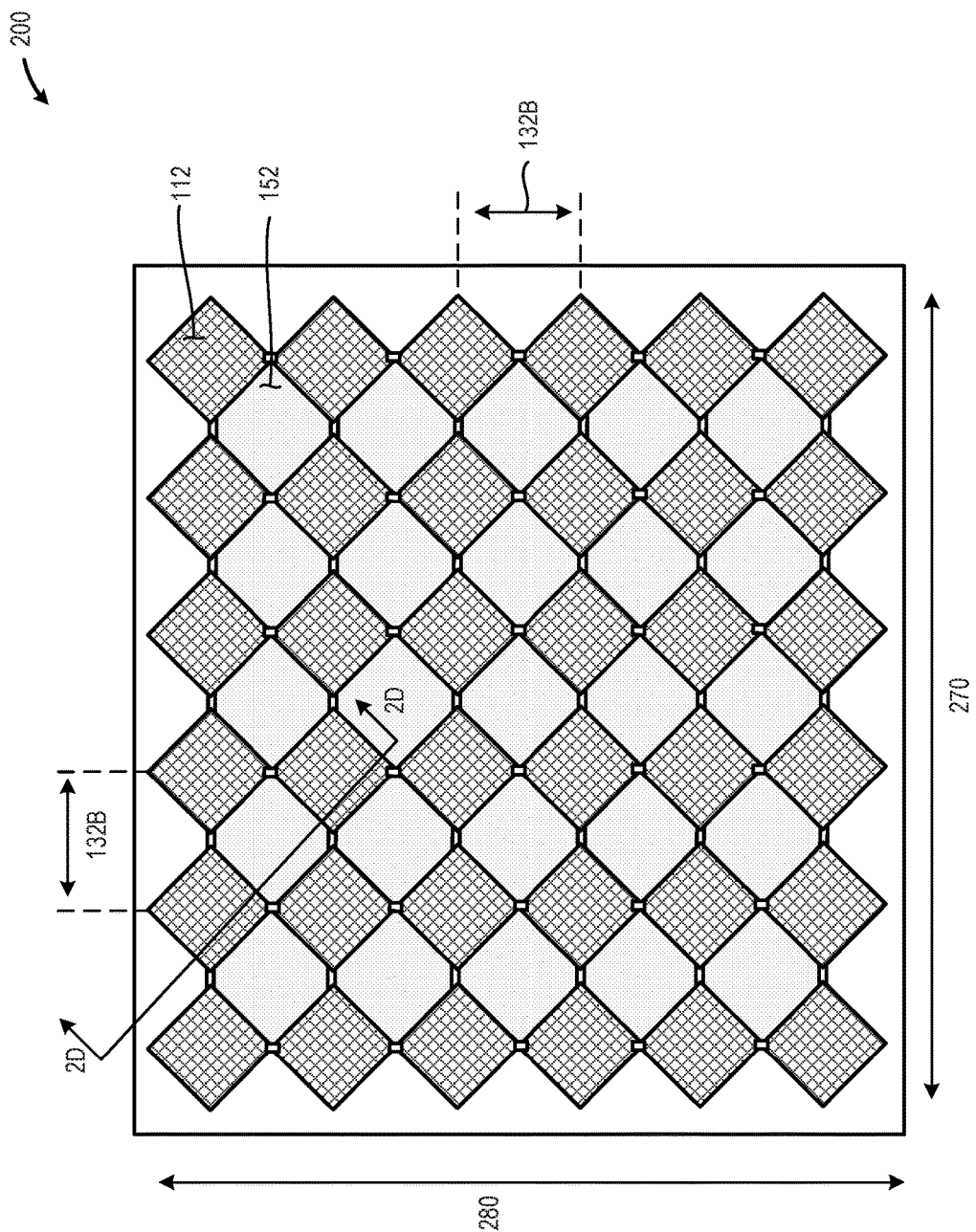
FIG. 2C is a plan view of the illustrative expandable display device in a stretched or expanded state to provide the second display area in which both the upper layer that includes 36 upper display elements and the lower layer that include 25 lower display elements are both visible, in accordance with at least one embodiment described herein.
Figure 2D:
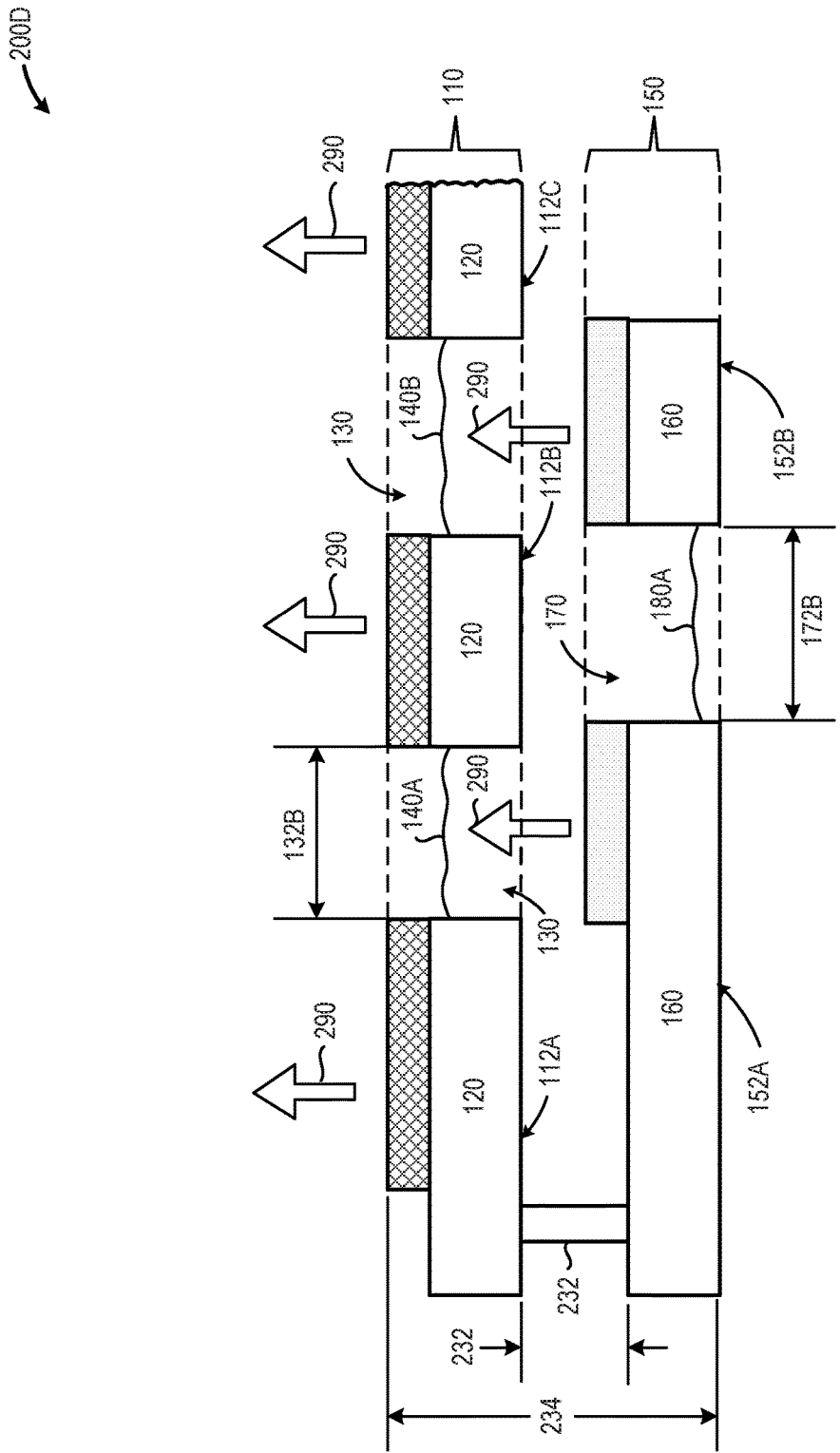
FIG. 2D is a partial cross-sectional view of the illustrative expandable display device depicted in FIG. 2C, along sectional line 2D-2D, in accordance with at least one embodiment described herein.

FIG. 2A is a plan view of an illustrative expandable display device 200 having a first display area that includes 6×6 upper display element 112 matrix, in accordance with at least one embodiment described herein. As depicted in FIG. 2A, the expandable display device 200 provides a first display area of width 210 by width 220. FIG. 2B is a partial cross-sectional view of the illustrative expandable display device 200 depicted in FIG. 2A, along sectional line 2B-2B, in accordance with at least one embodiment described herein. FIG. 2C is a plan view of the illustrative expandable display device 200 in a stretched or expanded state to provide the second display area in which both the upper layer 110 that includes 36 upper display elements 112 and the lower layer 150 that include 25 lower display elements 152 are both visible, in accordance with at least one embodiment described herein. As depicted in FIG. 2C, the expandable display device 200 provides a second display area of width 270 by height 280. FIG. 2D is a partial cross-sectional view of the illustrative expandable display device 200 depicted in FIG. 2C, along sectional line 2D-2D, in accordance with at least one embodiment described herein.

As depicted in FIG. 2A, when the expandable display device 200 is positioned in the first display position, only the upper display elements 112A-112n are visible to the system user. The lower display elements 152A-152n remain positioned beneath and obscured by the upper display elements 112A-112n. In the first display position, the one or more sensors 104 provide to the expandable display control circuitry 102 one or more position signals 106 that contain information and/or data indicative of the position of the upper layer 110 with respect to the lower layer 150. In response, since the lower display elements 152 are obscured, the expandable display control circuitry 102 may cause the display of an image using only the upper display elements 112, allowing the lower display elements 152 to remain inactivated and not illuminated. In the first display position that provides a display having a first display area having width 210 and height 220, a gap 130 having a width of less than: about 0.1 millimeters (mm); about 0.5 mm; about 1.0 mm; about 2 mm; or about 5 mm separates the upper display elements 112.

In embodiments, each of the upper display elements 112 includes a pixel matrix in the form of a rectangular or square display element having the same or different widths 212A-212n (collectively, "upper display element widths 212") and/or the same or different heights 222A-222n (collectively, upper display element heights 222"). For example, each of the upper display elements 112 may have a length 212 of: about: 0.5 centimeters (cm) or less; about 1 cm or less; or about 2 cm or less and a height of: about: 0.5 centimeters (cm) or less; about 1 cm or less; or about 2 cm or less. Thus, in the first display position, the expandable display device 200 may have a first display area of from about 3 cm by 3 cm to about 24 cm by 24 cm. Although a 6×6 matrix of upper display elements 112 is shown in FIG. 2A, the first display area may include any number of upper display elements 112.

Referring next to FIG. 2B, the relative positions of the upper display elements 112 and the lower display elements 152 when the expandable display device 200 is disposed in the first display position are depicted in a partial elevation view taken along sectional line 2B-2B. A spacer 230 positioned between the upper layer 110 and the lower layer 150 maintains a separation distance 232 between the upper layer 110 and the lower layer 150. With the addition of the spacer 230, the expandable display device 200 has an overall thickness 234. As depicted in FIG. 2B, when the expandable display device 200 is disposed in the first display position, the lower display elements 152 are at least partially obscured by the upper display elements 112. In embodiments, the spacer 230 permits the free displacement of the upper layer 110 and the lower layer 150. The spacer 230 may maintain a separation distance 232 of less than: about 1 millimeter (mm); about 2 mm; about 3 mm; about 5 mm; or about 10 mm. In embodiments, the spacer 230 causes an overall expandable display device thickness of less than: about 3 millimeters (mm); about 7 mm; about 10 mm; or about 15 mm.

The detail 206B in FIG. 2B provides an elevation view of an illustrative display element. Although the detail depicts an elevation of a display element 112 included in the upper layer 110, such construction may also apply to the display elements 152 included in the lower layer 150. Each of the upper display elements 112 and/or the lower display elements 152 may include an encapsulant material 240 disposed in, on, about, or across all or a portion of a pixel layer 250 that is disposed in, on, about, or across all or a portion of a circuitry layer 260 that controls the function and/or operation of the pixels included in the pixel layer 250. The upper display elements 112 are disposed in, on, about, or across all or a portion of the surface of the expandable substrate 120. The lower display elements 152 are disposed in, on, about, or across all or a portion of the surface of the expandable substrate 160. Although not depicted in detail 206B, in some implementations, some or all of the upper display elements 112 and/or some or all of the lower display elements 152 may include an electromagnetic output layer disposed between the pixel layer 250 and the circuitry layer 260. When present, such an electromagnetic output layer provides narrow spectrum or broad spectrum electromagnetic output, at least a portion of which passes through the pixel layer 250, providing a display image to a user viewing the expandable display device 200.

The encapsulant 240 is an optically translucent or transparent material that protects the display elements from damage. The pixel layer 250 may include any currently available or future developed illumination technology, such as: light emitting diodes (LEDs); organic light emitting diodes (OLEDs); polymer light emitting diodes (PLEDs); quantum dots; or similar. In embodiments, the pixels included in the pixel layer 250 may include a plurality of narrow spectrum sources (e.g., red pixels, green pixels, and blue pixels) arranged in a defined pattern, such as a Bayer filter pattern. In embodiments, the pixels included in the pixel layer 250 may include one or more broad spectrum sources (e.g., white light source) and the pixel layer may include a color filter layer. The circuitry layer 260 in the upper display elements 112 is conductively coupled to the flexible connectors 140 and provides power and control signals from the expandable display control circuitry 102 to each of the pixels included in each upper display element 152. The circuitry layer 260 in the lower display elements 152 is conductively coupled to the flexible connectors 180 and provides power and control signals from the expandable display control circuitry 102 to each of the pixels included in each upper display element 152. In embodiments, the circuitry layer 260 may include any number and/or combination of currently available and/or future developed electronic components, semiconductor devices, and/or logic elements. Example components that may be found in the circuitry layer 260 include but are not limited to: amorphous silicon thin film transistors (a-Si TFTs); polycrystalline TFTs (pc-Si TFTs), organic TFTs (OTFTs), embedded passive components and the like.

Turning next to FIG. 2C, the expanded display device 200 is depicted in the second display position in which the second display area has an increased width 270 and an increased height 280. The spacing between the upper display elements 112 has increased from the first gap 130 spacing 132A to a second gap 130 spacing 132B that exposes at least a portion of the lower display elements 152. In embodiments, when in the second display position, the expandable display device 200 may have an extended width 270 that is greater than: about 1.25×; about 1.5×; about 1.75×; or about 2.0× the width 210 when the expandable display device is disposed in the first display position. In embodiments, when in the extended second display position, the expandable display device 200 may have an extended height 280 that is greater than: about 1.25×; about 1.5×; about 1.75×; or about 2.0× the height 220 when the expandable display device 200 is disposed in the first display position.

Turning to FIG. 2D, the relative positions of the upper display elements 112 and the lower display elements 152 when the expandable display device 200 is disposed in the second display position are depicted in a partial elevation view. As depicted in FIG. 2D, emissions 290 from both the upper display elements 112 and the lower display elements 152 are now visible. The spacing 132B of gaps 130 separating the upper display elements 112 included in the upper display layer 110 has increased over the spacing 132A when the expandable display device 200 is disposed in the first display position. Similarly, the spacing 172B of gaps 170 separating the lower display elements 152 included in the lower display layer 150 has increased over the spacing 172A when the expandable display device 200 is disposed in the first display position. In embodiments, when in the extended second display position, the gap spacing 132B separating the upper display elements 112 included in the upper display layer 110 may be greater than: about 1.25×; about 1.5×; about 1.75×; or about 2.0× of the gap spacing 132A when the expandable display device 200 is disposed in the first display position. In embodiments, when in the extended second display position, the gap spacing 172B separating the lower display elements 152 included in the lower display layer 150 may be greater than: about 1.25×; about 1.5×; about 1.75×; or about 2.0× of the gap spacing 152A when the expandable display device 200 is disposed in the first display position.

Figure 3A:
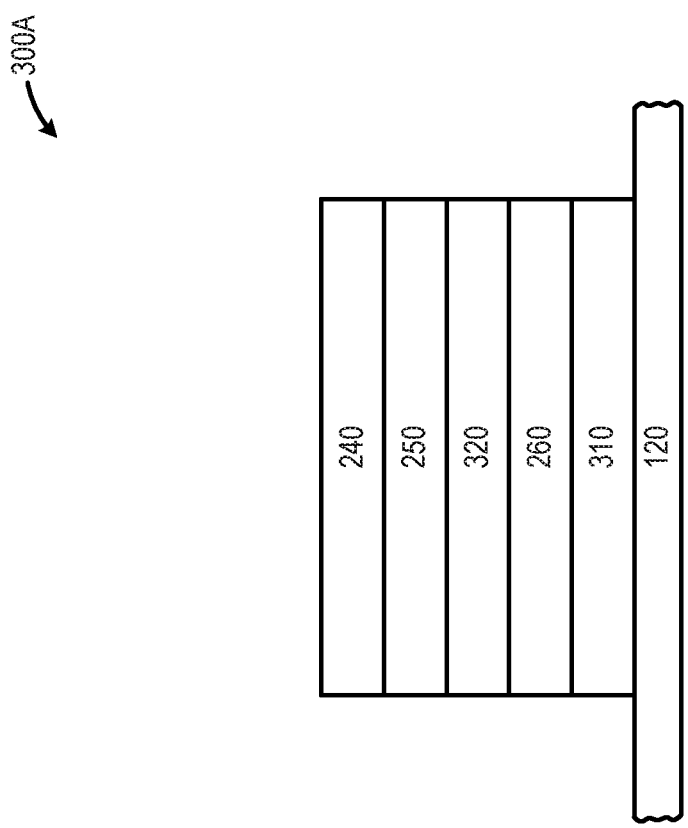
FIG. 3A is a cross-sectional elevation of another illustrative upper display element that includes a rigid substrate, in accordance with at least one embodiment described herein.
Figure 3B:
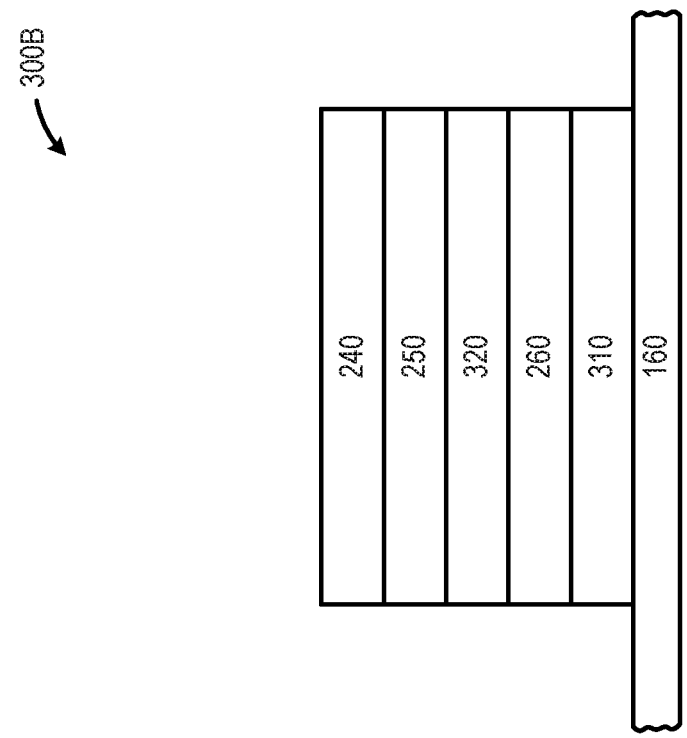
FIG. 3B is a cross-sectional elevation of another illustrative lower display element that includes a rigid substrate, in accordance with at least one embodiment described herein.

FIG. 3A is a cross-sectional elevation of another illustrative upper display element 300A that includes a rigid substrate 310, in accordance with at least one embodiment described herein. FIG. 3B is a cross-sectional elevation of another illustrative lower display element 300B that includes a rigid substrate 300B, in accordance with at least one embodiment described herein. As depicted in FIG. 3A, in embodiments, the upper display element 300A may be separately fabricated on a rigid substrate layer 310 which is then bonded to otherwise affixed to the surface of the expandable substrate 120. As depicted in FIG. 3B, in embodiments, the lower display element 300B may be separately fabricated on a rigid substrate layer 310 which is then bonded to otherwise affixed to the surface of the expandable substrate 160. The rigid substrate layer 310 may include any rigid dielectric material capable of being bonded to an underlying expandable substrate.

In embodiments, the upper display element 300A and/or the lower display element may include one or more illumination layers 320 that generate and emit either a narrow spectrum electromagnetic energy (e.g., electromagnetic radiation emissions in the blue or ultraviolet spectrum) or broad spectrum electromagnetic energy (e.g., electromagnetic radiation emission across all or a portion of the visible electromagnetic spectrum). In embodiments, the one or more illumination layers 320 may be used on conjunction with a quantum dot pixel layer 250. In such embodiments, the circuitry layer 260 may provide power and/or control signaling to the illumination layer 320.

Figure 4:
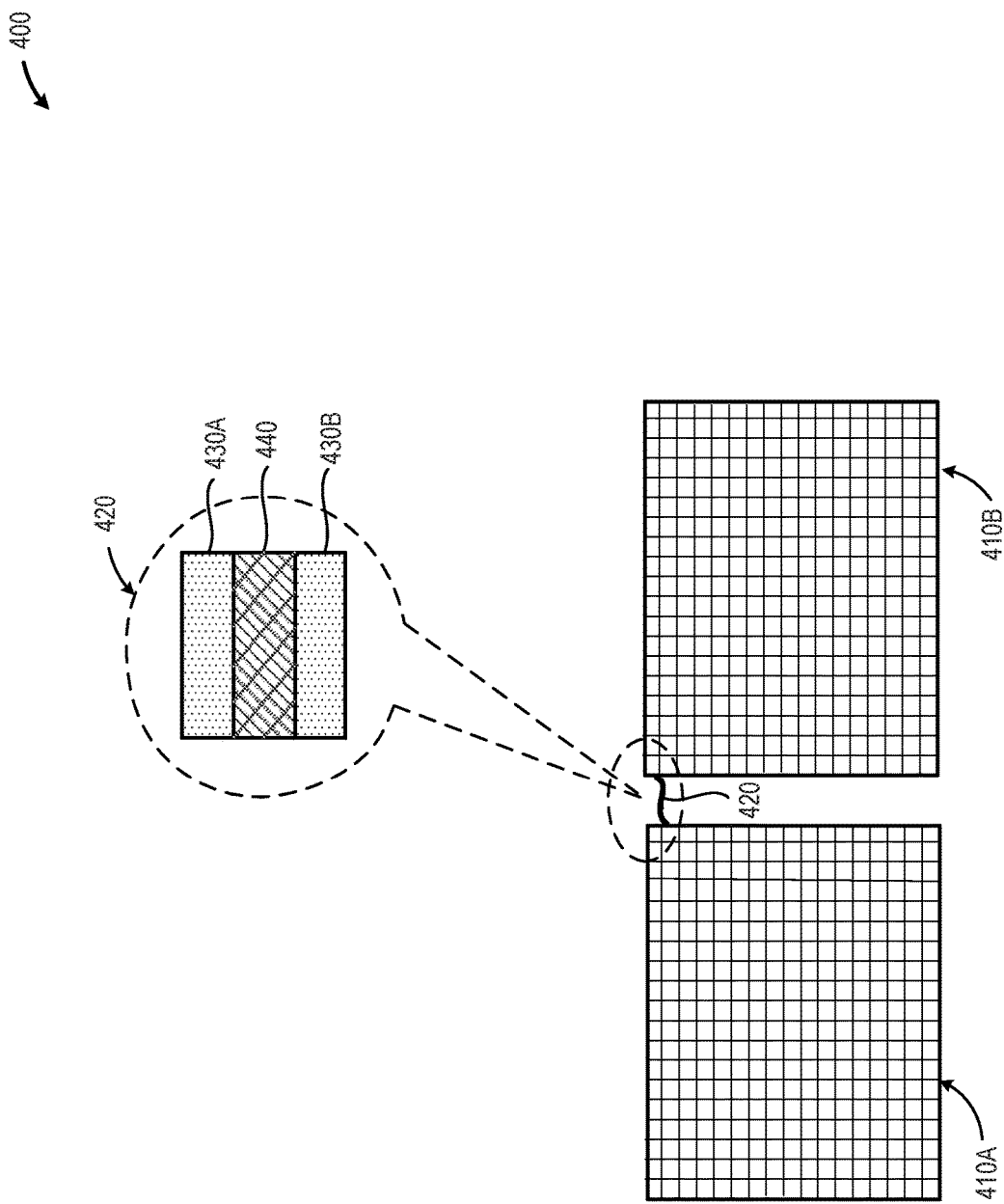
FIG. 4 is a plan view of an illustrative system that includes two display elements conductively coupled using a flexible interconnect, in accordance with at least one embodiment described herein.

FIG. 4 is a plan view of an illustrative system 400 that includes two display elements 410A and 410B conductively coupled using a flexible interconnect 420, in accordance with at least one embodiment described herein. The display elements 410A and 410B may represent either or both upper display elements 112 and/or lower display elements 152. The flexible interconnect 420 may represent either or both upper flexible interconnects 140 and/or lower flexible interconnects 180.

The flexible interconnect 420 includes one or more conductive traces 430 disposed within a flexible dielectric material 440. In embodiments, an example flexible dielectric material 440 may include one or more polyimides. The flexible interconnect 420 may have any shape or physical geometry capable of accommodating the movement of the display elements 410 from the first display position to the second display position. Example shapes or physical geometries suitable for use as a flexible interconnect 420 may include but are not limited to: spring-like structures; dogbone like structures; or three-dimensional buckle structures.

Figure 5:
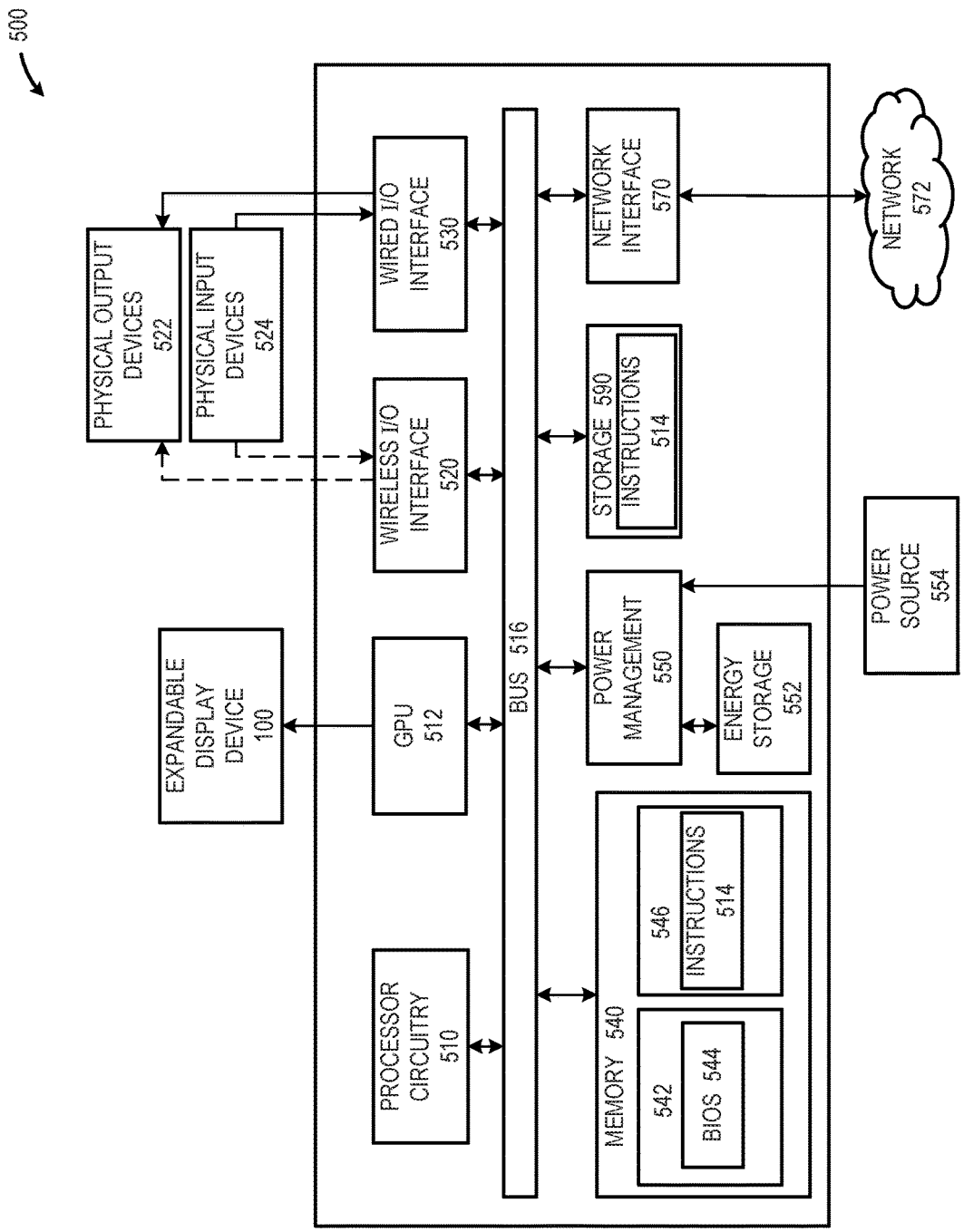
FIG. 5 is a schematic diagram of an illustrative electronic, processor-based, device that includes processor circuitry and a graphics processing unit coupled to an expandable display device such as described in detail with regard to FIGS. 1-4, in accordance with at least one embodiment described herein.

FIG. 5 is a schematic diagram of an illustrative electronic, processor-based, device 500 that includes processor circuitry 510 and a graphics processing unit 512 coupled to an expandable display device such as described in detail with regard to FIGS. 1-4, in accordance with at least one embodiment described herein. The processor-based device 500 may additionally include one or more of the following: a wireless input/output (I/O) interface 520, a wired I/O interface 530, system memory 540, power management circuitry 550, a network interface 570, and a non-transitory storage device 590. The following discussion provides a brief, general description of the components forming the illustrative processor-based device 500. Example, non-limiting processor-based devices 500 may include, but are not limited to: smartphones, wearable computers, portable computing devices, handheld computing devices, desktop computing devices, blade server devices, workstations, and similar.

The processor circuitry 510 may include any number, type, or combination of currently available or future developed devices capable of executing machine-readable instruction sets. The processor circuitry 510 may include but is not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), programmable logic units, field programmable gate arrays (FPGAs), and the like. Unless described otherwise, the construction and operation of the various blocks shown in FIG. 5 are of conventional design. Consequently, such blocks need not be described in further detail herein, as they will be understood by those skilled in the relevant art. A bus 516 interconnects at least some of the components of the processor-based device 500 and may employ any currently available or future developed serial or parallel bus structures or architectures.

In embodiments, the processor-based device 500 includes graphics processor circuitry 512 capable of executing machine-readable instruction sets 514 and generating an output signal capable of providing a display output to the LCD display device 100. Those skilled in the relevant art will appreciate that the illustrated embodiments as well as other embodiments may be practiced with other processor-based device configurations, including portable electronic or handheld electronic devices, for instance smartphones, portable computers, wearable computers, consumer electronics, personal computers ("PCs"), network PCs, minicomputers, server blades, mainframe computers, and the like. The processor circuitry 510 may include any number of hardwired or configurable circuits, some or all of which may include programmable and/or configurable combinations of electronic components, semiconductor devices, and/or logic elements that are disposed partially or wholly in a PC, server, or other computing system capable of executing machine-readable instructions.

The processor-based device 500 includes a bus or similar communications link 516 that communicably couples and facilitates the exchange of information and/or data between various system components including the processor circuitry 510, the graphics processor circuitry 512, one or more wireless I/O interfaces 520, one or more wired I/O interfaces 530, the system memory 540, one or more network interfaces 570, and/or one or more storage devices 590. The processor-based device 500 may be referred to in the singular herein, but this is not intended to limit the embodiments to a single processor-based device 500, since in certain embodiments, there may be more than one processor-based device 500 that incorporates, includes, or contains any number of communicably coupled, collocated, or remote networked circuits or devices.

The system memory 540 may include read-only memory ("ROM") 542 and random access memory ("RAM") 546. A portion of the ROM 542 may be used to store or otherwise retain a basic input/output system ("BIOS") 544. The BIOS 544 provides basic functionality to the processor-based device 500, for example by causing the processor circuitry 510 to load and/or execute one or more machine-readable instruction sets 514. In embodiments, at least some of the one or more machine-readable instruction sets 514 cause at least a portion of the processor circuitry 510 to provide, create, produce, transition, and/or function as a dedicated, specific, and particular machine, for example a word processing machine, a digital image acquisition machine, a media playing machine, a gaming system, a communications device, a smartphone, or similar.

The processor-based device 500 may include at least one wireless input/output (I/O) interface 520. The at least one wireless I/O interface 520 may be communicatively coupled to one or more physical output devices 522 (tactile devices, video displays, audio output devices, hardcopy output devices, etc.). The at least one wireless I/O interface 520 may communicably couple to one or more physical input devices 524 (pointing devices, touchscreens, keyboards, tactile devices, etc.). The at least one wireless I/O interface 520 may include any currently available or future developed wireless I/O interface. Example wireless I/O interfaces include, but are not limited to: BLUETOOTH®, near field communication (NFC), and similar.

The processor-based device 500 may include one or more wired input/output (I/O) interfaces 530. The at least one wired I/O interface 530 may be communicably coupled to one or more physical output devices 522 (tactile devices, video displays, audio output devices, hardcopy output devices, etc.). The at least one wired I/O interface 530 may be communicably coupled to one or more physical input devices 524 (pointing devices, touchscreens, keyboards, tactile devices, etc.). The wired I/O interface 530 may include any currently available or future developed I/O interface. Example wired I/O interfaces include, but are not limited to: universal serial bus (USB), IEEE 1394 ("FireWire"), and similar.

The processor-based device 500 may include one or more communicably coupled, non-transitory, data storage devices 590. The data storage devices 590 may include one or more hard disk drives (HDDs) and/or one or more solid-state storage devices (SSDs). The one or more data storage devices 590 may include any current or future developed storage appliances, network storage devices, and/or systems. Non-limiting examples of such data storage devices 590 may include, but are not limited to, any current or future developed non-transitory storage appliances or devices, such as one or more magnetic storage devices, one or more optical storage devices, one or more electro-resistive storage devices, one or more molecular storage devices, one or more quantum storage devices, or various combinations thereof. In some implementations, the one or more data storage devices 590 may include one or more removable storage devices, such as one or more flash drives, flash memories, flash storage units, or similar appliances or devices capable of communicable coupling to and decoupling from the processor-based device 500.

The one or more data storage devices 590 may include interfaces or controllers (not shown) communicatively coupling the respective storage device or system to the bus 516. The one or more data storage devices 590 may store, retain, or otherwise contain machine-readable instruction sets, data structures, program modules, data stores, databases, logical structures, and/or other data useful to the processor circuitry 510 and/or graphics processor circuitry 512 and/or one or more applications executed on or by the processor circuitry 510 and/or graphics processor circuitry 512. In some instances, one or more data storage devices 590 may be communicably coupled to the processor circuitry 510, for example via the bus 516 or via one or more wired communications interfaces 530 (e.g., Universal Serial Bus or USB); one or more wireless communications interfaces 520 (e.g., Bluetooth®, Near Field Communication or NFC); and/or one or more network interfaces 570 (IEEE 802.3 or Ethernet, IEEE 802.11, or WiFi®, etc.).

Machine-readable instruction sets 514 and other programs, applications, logic sets, and/or modules may be stored in whole or in part in the system memory 540. Such instruction sets 514 may be transferred, in whole or in part, from the one or more data storage devices 590. The instruction sets 514 may be loaded, stored, or otherwise retained in system memory 540, in whole or in part, during execution by the processor circuitry 510 and/or graphics processor circuitry 512.

The processor-based device 500 may include power management circuitry 550 that controls one or more operational aspects of the energy storage device 552. In embodiments, the energy storage device 552 may include one or more primary (i.e., non-rechargeable) or secondary (i.e., rechargeable) batteries or similar energy storage devices. In embodiments, the energy storage device 552 may include one or more supercapacitors or ultracapacitors. In embodiments, the power management circuitry 550 may alter, adjust, or control the flow of energy from an external power source 554 to the energy storage device 552 and/or to the processor-based device 500. The power source 554 may include, but is not limited to, a solar power system, a commercial electric grid, a portable generator, an external energy storage device, or any combination thereof.

For convenience, the processor circuitry 510, the graphics processor circuitry 512, the wireless I/O interface 520, the wired I/O interface 530, the system memory 540, the power management circuitry 550, the network interface 570, and the storage device 590 are illustrated as communicatively coupled to each other via the bus 516, thereby providing connectivity between the above-described components. In alternative embodiments, the above-described components may be communicatively coupled in a different manner than illustrated in FIG. 5. For example, one or more of the above-described components may be directly coupled to other components, or may be coupled to each other, via one or more intermediary components (not shown). In another example, one or more of the above-described components may be integrated into the processor circuitry 510 and/or the graphics processor circuitry 512. In some embodiments, all or a portion of the bus 516 may be omitted and the components are coupled directly to each other using suitable wired or wireless connections.

Figure 6:
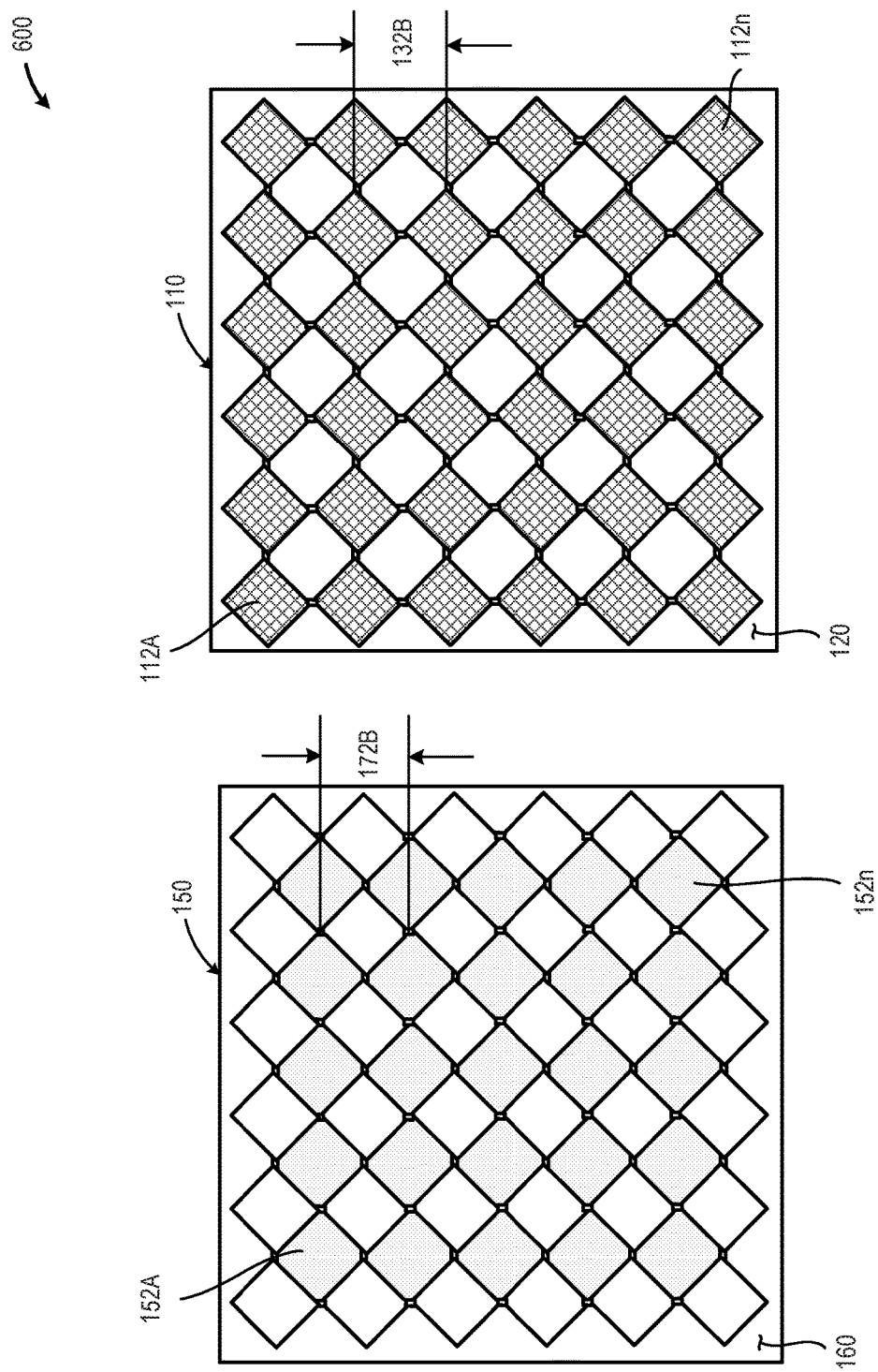
FIG. 6 is a plan view of an illustrative expandable display system that includes an upper display layer and an lower display layer that are shown separated, in accordance with at least one embodiment described herein.

FIG. 6 is a plan view of an illustrative expandable display system 600 that includes an upper display layer 110 and a lower display layer 150 that are shown separated, in accordance with at least one embodiment described herein. The expandable display system 600 is depicted in the second display position in which each of the plurality of lower display elements 152A-152n included in the lower display layer 150 are visible through gaps or voids 132B that exist between each of the plurality of upper display elements 112A-112n included in the upper display layer 110.

FIGS. 7A through 7G depict an illustrative method 700 for manufacturing or producing an illustrative expandable display device such as depicted and described in FIGS. 1-6, in accordance with at least one embodiment described herein. As used in FIGS. 7A through 7G, the display element 710 may represent either or both an upper display element 112 and/or a lower display element 152.

Figure 7A:
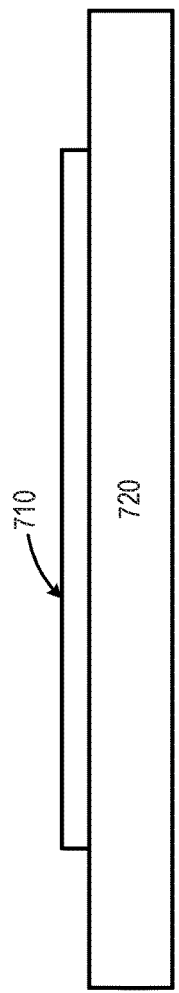
FIG. 7A is an elevation depicting the detachable attachment or detachable affixing of an illustrative upper surface of a display element to an illustrative first rigid carrier member, in accordance with at least one embodiment described herein.

FIG. 7A is an elevation depicting the detachable attachment or detachable affixing of an illustrative upper surface of a display element 710 to an illustrative first rigid carrier member 720, in accordance with at least one embodiment described herein. Although FIG. 7A depicts only a single display element, the method 700 may be extended to cover any number of upper display elements 112A-112n and any number of lower display elements 152A-152n. In embodiments, the first rigid carrier member 720 may include any planar member having dimensions at least equal to the dimensions of the expandable display device when disposed in the second display position.

Figure 7B:
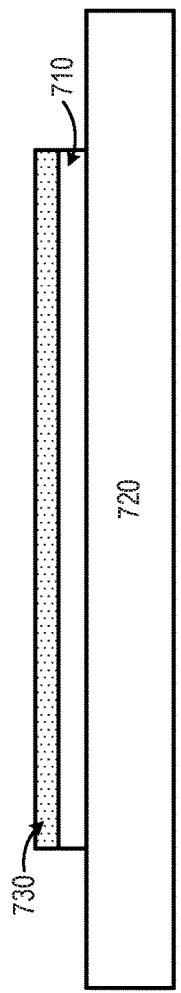
FIG. 7B is an elevation depicting the deposition of an adhesive on, about, or across all or a portion of the lower surface of the display element, in accordance with at least one embodiment described herein.

FIG. 7B is an elevation depicting the deposition of an adhesive 730 on, about, or across all or a portion of the lower surface of the display element 710, in accordance with at least one embodiment described herein. In embodiments, the adhesive 730 may include one or more adhesive films. In other embodiments, the adhesive 730 may include one or more thermally, chemically, or photochemically activated materials.

FIG. 7C is an elevation depicting the detachable attachment or detachable affixing of a pre-strained (i.e., extended or displaced to the second display position) expandable substrate 740 to an illustrative second rigid carrier member 750. As used in FIGS. 7C through 7G, the expandable substrate 740 may represent either or both the upper layer expandable substrate 120 and/or the lower layer expandable substrate 160. The expandable substrate 740 may include one or more elastomeric or polymeric materials having dielectric properties.

FIG. 7D is an elevation depicting the attachment or affixing of the back side of the display element 710 to the pre-strained (i.e., extended or displaced to the second display position) expandable substrate 740. As depicted in FIG. 7D, after affixing the back side of the display element 710 to the pre-strained expandable substrate 740, the rigid support member 720 is detached from the upper surface of the display element 710. The resultant structure includes the display element 710 affixed to the pre-strained expandable substrate 740 by the adhesive 730. The pre-strained expandable substrate 740 is detachably attached to the second rigid carrier member 750.

Figure 7E:
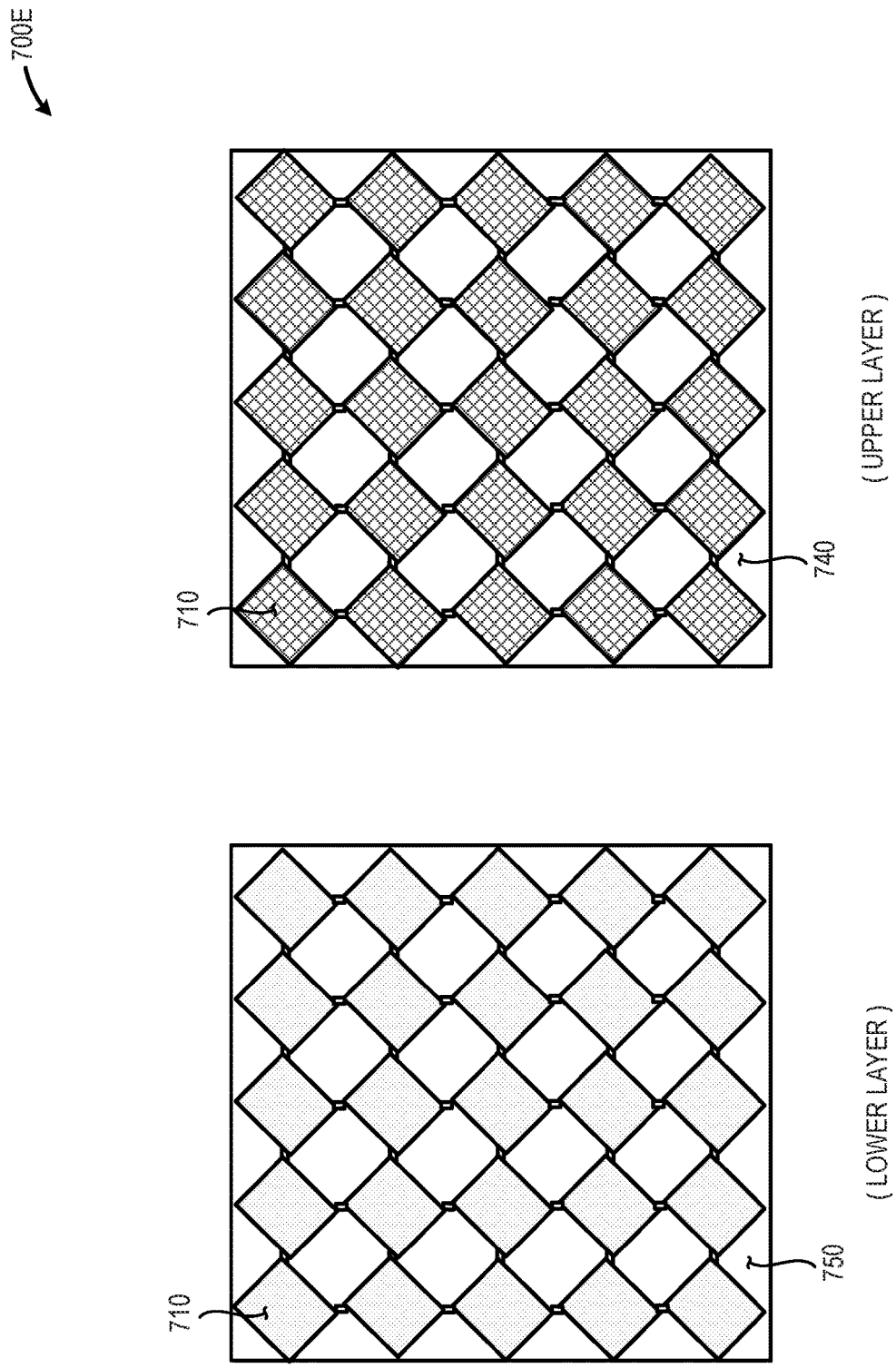
FIG. 7E is a plan view of an illustrative upper layer that includes a plurality of display elements disposed across all or a portion of the pre-strained expandable substrate and an illustrative lower layer that includes a plurality of display elements disposed across all or a portion of the pre-strained expandable substrate, in accordance with at least one embodiment described herein.

FIG. 7E is a plan view of an illustrative upper layer 110 that includes a plurality of display elements 710 disposed across all or a portion of the pre-strained expandable substrate 740 and an illustrative lower layer 150 that includes a plurality of display elements 710 disposed across all or a portion of the pre-strained expandable substrate 740, in accordance with at least one embodiment described herein. As depicted in FIG. 7E, the pre-strained expandable substrate may be removed from the areas between the display elements 710.

Figure 7F:
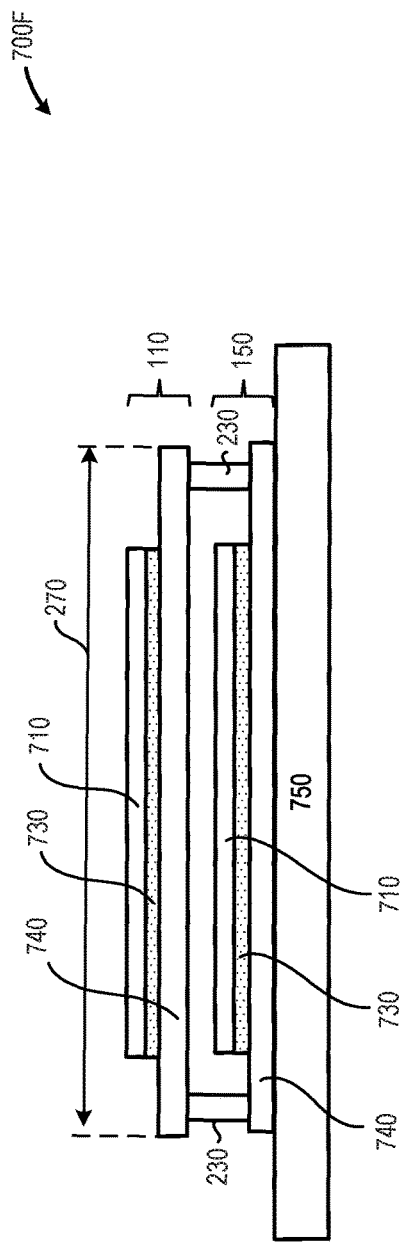
FIG. 7F is an elevation depicting an expandable display device having the upper layer stacked on the lower layer and separated by spacer member, in accordance with at least one embodiment described herein.

FIG. 7F is an elevation depicting an expandable display device having the upper layer 110 stacked on the lower layer 150 and separated by spacer member 230, in accordance with at least one embodiment described herein. As depicted in FIG. 7F, the expandable substrate 740 remains in a pre-strained state and the expandable display device is maintained in the second display position having width 270.

Figure 7G:
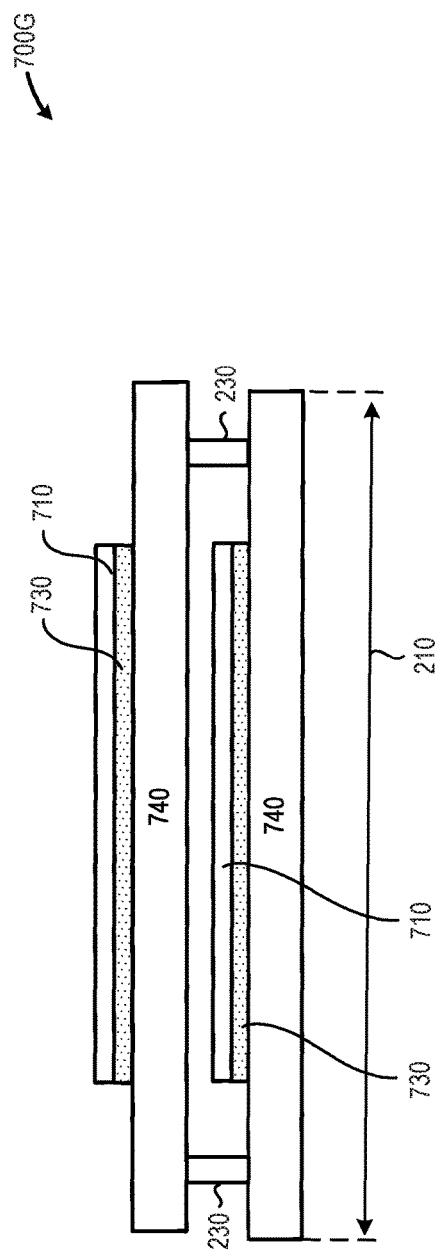
FIG. 7G is an elevation depicting the expandable display device in which the expandable substrate has been released and the expandable display device returns to the first display position having width, in accordance with at least one embodiment described herein.

FIG. 7G is an elevation depicting the expandable display device in which the expandable substrate 740 has been released and the expandable display device returns to the first display position having width 210.

Figure 8:
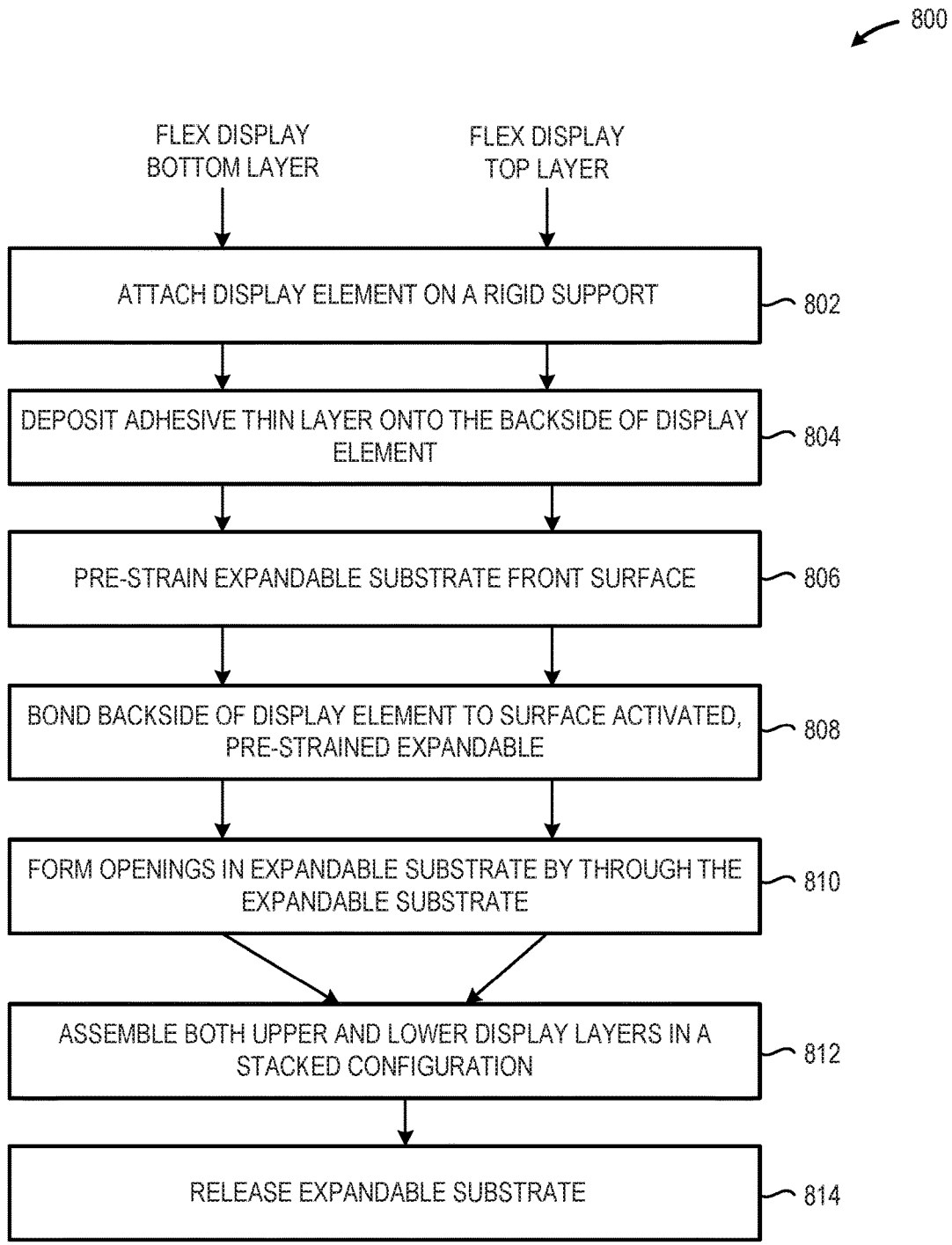
FIG. 8 is a high-level flow diagram depicting an illustrative expandable display device manufacturing method, in accordance with at least one embodiment described herein.

FIG. 8 is a high-level flow diagram depicting an illustrative expandable display device manufacturing method 800, in accordance with at least one embodiment described herein. It should be noted that the method defined by 802 through 810 is performed once for the upper layer 110 and once for the lower layer 150.

At 802, each of the plurality of display elements is detachably attached to a rigid support member. In embodiments, an upper surface of each of the plurality of display elements may be detachably attached to the rigid support member in the locations each of the respective plurality of display elements will occupy when the expandable display device is disposed in the second display position.

At 804, an adhesive is patterned, deposited, applied, or otherwise disposed across all or a portion of the exposed lower surfaces of each of the plurality of display elements.

In embodiments, the adhesive may be deposited, applied, or otherwise disposed across all or a portion of the exposed lower surfaces of each of the plurality of display elements using any currently available or future developed material deposition processes or methods.

At 806, an expandable substrate is pre-strained by displacing or otherwise stretching the expandable substrate from the first display position to the second display position. The pre-strained expandable substrate is maintained in the pre-strained state by anchoring the expandable substrate to a rigid carrier member. In some embodiments, the surface of the pre-strained expandable substrate may be chemically, photochemically, or thermally activated in preparation for bonding to the plurality of display elements.

At 808, the adhesive disposed across the back of each of the plurality of display elements is physically and/or chemically bonded to the activated surface of the pre-strained expandable substrate.

At 810, portions of the pre-strained expandable substrate between some or all of the plurality of display elements may be physically or chemically removed using any currently available or future developed material removal process or method. In embodiments, the portions of the pre-strained expandable substrate between some or all of the plurality of display elements is removed by cutting, pressing, or physical abrasion. The method of 802 through 810 is performed once to create the upper display layer 110 and once to create the lower display layer 150.

At 812, while the upper display layer substrate and the lower display layer substrate remain in a pre-strained state, the upper display layer 110 is stacked on the lower display layer 150 to produce the expandable display device. In embodiments, spacers 230 may be disposed between the upper display layer 110 and the lower display layer 150. In embodiments the spacers 230 may physically couple the upper display layer 110 to the lower display layer 150.

At 814, the pre-strained upper display layer substrate and the lower display layer substrate are released allowing the upper display layer 110 and the lower display layer 150 to return to the unstrained first display state.

Figure 9:
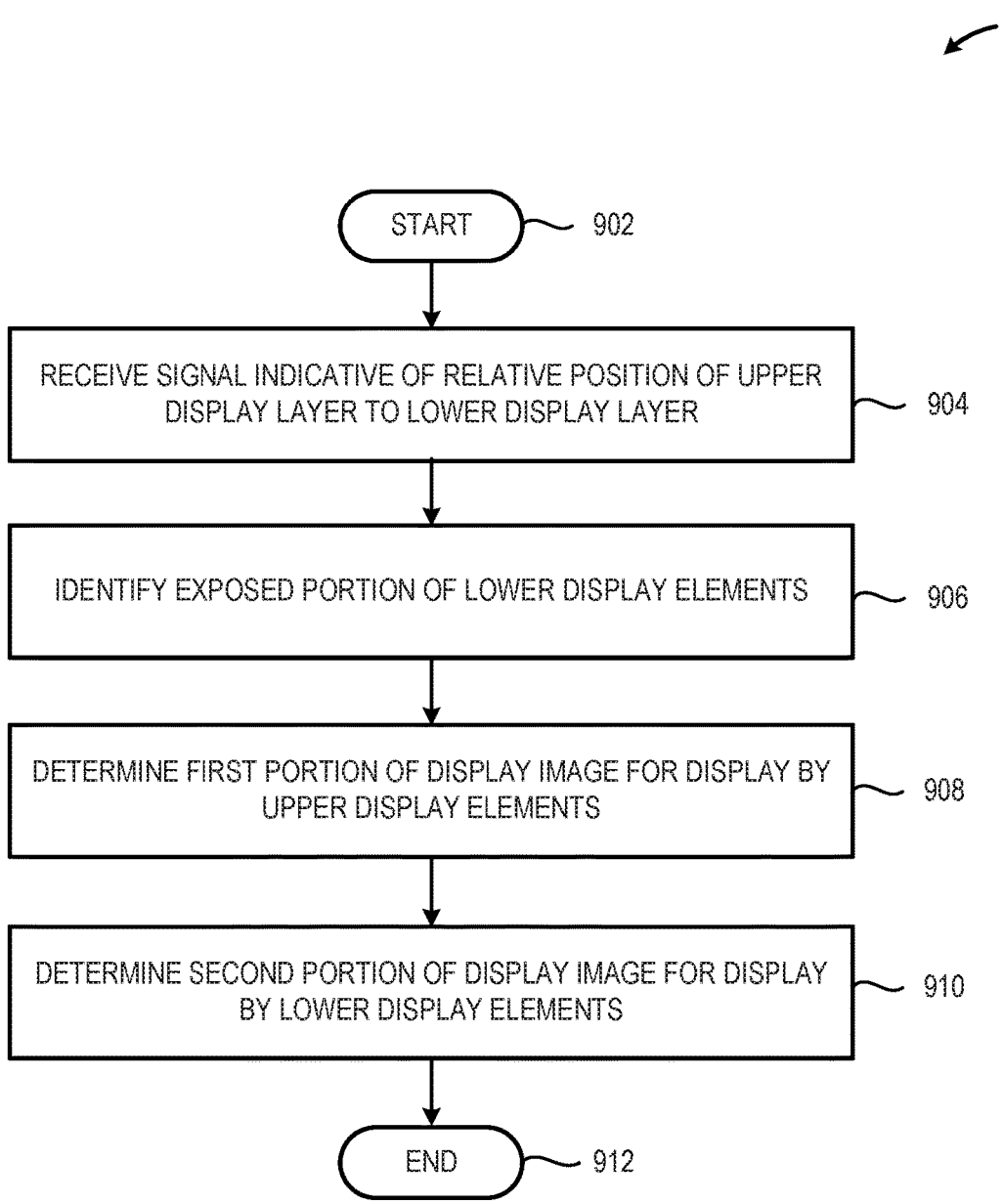
FIG. 9 is a high level logic flow diagram of an illustrative method for providing a display image on an expandable display device such as described above in FIGS. 1 through 6 while maintaining a fixed pixel density in the display image, in accordance with at least one embodiment described herein.

FIG. 9 is a high level logic flow diagram of an illustrative method 900 for providing a display image on an expandable display device such as described above in FIGS. 1 through 6 while maintaining a fixed pixel density in the display image, in accordance with at least one embodiment described herein. The expandable display device includes an upper display layer 110 that includes a plurality of upper display elements 112, each having a defined pixel density and a lower display layer 150 that includes a plurality of lower display elements 152, each having the defined pixel density. The expandable display device 100 may be reversibly, continuously displaced between a first display position that includes a relatively small first display area and a second display position that includes a relatively large second display area. The pixel density of the display image beneficially remains constant at the defined pixel density at the first display position, the second display position, and all points between the first display position and the second display position. The method 900 commences at 902.

At 904, the expandable display control circuitry 102 receives one or more signals 106 from one or more sensors 104. The one or more signals 106 include information and/or data associated with the relative position of the upper layer 110 with respect to the lower layer 150.

At 906, the expandable display control circuitry 102 determines the visible portion of each of the upper display elements 112 included in the upper display layer 110 (e.g., 100% of the upper display elements are visible to a user) and the visible portion of each of the lower display elements 152 included in the lower display layer 150. The visible portion of each of the lower display elements 152 varies from about 0% when the expandable display device 100 is in the first display position up to about 100% when the expandable display device 100 is in the second display position. If the expandable display device 100 is in the first display position, the one or more signals 106 will include information used by the expandable display control circuitry 102 to determine that the upper display elements 112 completely obscure the lower display elements 152. In another example, if the upper display layer 110 is positioned halfway between the first display position and the second display position, the one or more signals 106 will include information used by the expandable display control circuitry 102 to determine the upper display elements 112 and about one half of each of the lower display elements 152 are exposed. In yet another example, if the upper display layer 110 is positioned in the second display position, the one or more signals 106 will include information used by the expandable display control circuitry 102 to determine the upper display elements 112 and the lower display elements 152 are exposed.

At 908, the expandable display control circuitry 102 apportions a display image between the upper display elements 112 and the visible portion of the lower display elements 152. The expandable display control circuitry 102 determines a first portion of the display image for display and/or presentation via the upper display elements 112.

At 910, the expandable display control circuitry 102 determines a second portion of the display image for display and/or presentation via the visible portions of each of the lower display elements 152. The method 900 concludes at 912.

While FIGS. 7, 8, and 9 illustrate various operations according to one or more embodiments, it is to be understood that not all of the operations depicted in FIGS. 7, 8, and 9 are necessary for other embodiments. Indeed, it is fully contemplated herein that in other embodiments of the present disclosure, the operations depicted in FIGS. 7, 8, and 9 and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

As used in any embodiment herein, the terms "system" or "module" may refer to, for example, software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., nonvolatile) in memory devices.

As used in any embodiment herein, the term "circuitry" may comprise, for example, singly or in any combination, hardwired circuitry, programmable circuitry such as computer processors comprising one or more individual instruction processing cores, state machine circuitry, and/or firmware that stores instructions executed by programmable circuitry or future computing paradigms including, for example, massive parallelism, analog or quantum computing, hardware embodiments of accelerators such as neural net processors and non-silicon implementations of the above. The circuitry may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eM-MCs), secure digital input/output (SDIO) cards, magnetic or optical cards, or any type of media suitable for storing electronic instructions. Other embodiments may be implemented as software executed by a programmable control device.

Thus, the present disclosure is directed to systems and methods of forming an expandable display device capable of maintaining a fixed pixel density at any display area from a relatively smaller first display area to a relatively larger second display area. The expandable display device includes an upper display layer and a lower display layer. In a first display position, the display elements having a defined pixel density included in the upper display layer obscure the display elements having the defined pixel density included in the lower display layer. The upper display layer and lower display layers are disposed on respective expandable substrates capable of continuous, reversible, displacement between the first display position and the second display position. In the second display position, the display elements included in the lower display layer are visible through gaps, voids, or apertures formed between the display elements included in the upper display layer. The resultant display provides a uniform pixel density at all displacements from the first display position to the second display position.

The following examples pertain to further embodiments. The following examples of the present disclosure may comprise subject material such as at least one device, a method, at least one machine-readable medium for storing instructions that when executed cause a machine to perform acts based on the method, means for providing an expandable display device that includes an expandable upper display layer containing a plurality of display elements and an expandable lower display layer containing a plurality of display elements. The display elements included in the upper display layer and the display elements included in the lower display layer have similar or identical pixel densities. The resultant expandable display device advantageously provides the same pixel density at all displacements from the first, relatively smaller area, display position through the second, relatively larger display area.

According to example 1, there is provided a variable viewing area display device continuously displaceable between a first display position that provides a first display area and a second display position that provides a second display area, the second display area larger than the first display area. The display device may include: an upper display layer that includes a plurality of upper display elements disposed on an expandable substrate, the expandable substrate continuously displaceable between the first display position and the second display position; a lower display layer that includes a plurality of lower display elements disposed on an expandable substrate, the expandable substrate continuously displaceable between the first display position and the second display position wherein: in the first display position the plurality of upper display elements obscure at least a portion of the plurality of lower display elements; as the display device is displaced from the first position to the second position, at least a portion of each of the plurality of lower display elements are visible through void spaces formed in the expandable substrate of the upper display layer between each of at least some of the plurality of upper display elements; and in the second position each of the plurality of lower display elements are visible through the void spaces formed in the expandable substrate of the upper display layer between each of at least some of the plurality of upper display elements.

Example 2 may include elements of example 1 and the expandable display device includes: a plurality of upper flexible interconnects, each of the plurality of upper flexible interconnects conductively coupling each of the plurality of upper display elements to at least one other of the upper display elements included in the plurality of upper display elements; and a plurality of lower flexible interconnects, each of the plurality of lower flexible interconnects conductively coupling each of the plurality of upper display elements to at least one other of the lower display elements included in the plurality of upper display elements.

Example 3 may include elements of any of examples 1 or 2 where each of the first plurality of flexible interconnects comprises at least one conductive layer disposed at least partially surrounded by a flexible dielectric material; and where at least a portion of the flexible interconnects included in the first plurality of flexible interconnects are biased toward the first display position.

Example 4 may include elements of any of examples 1 through 3 where each of the second plurality of flexible interconnects comprises at least one conductive layer at least partially surrounded by a flexible dielectric material; and where at least a portion of the flexible interconnects included in the second plurality of flexible interconnects are biased toward the first display position.

Example 5 may include elements of any of examples 1 through 4 where, in the first display position, the upper display elements are separated from at least one other of the upper display elements by a first distance of less than about 2 millimeters (mm).

Example 6 may include elements of any of examples 1 through 5 where, in the first display position, the lower display elements are separated from at least one other of the lower display elements by a first distance of less than about 2 millimeters (mm).

Example 7 may include elements of any of examples 1 through 6 where each of the upper display elements included in the plurality of upper display elements may include: a flexible support layer; a pixel circuit layer disposed physically proximate to the flexible support layer; a light emitting layer conductively coupled to and disposed physically proximate the pixel circuit layer; and a flexible encapsulant disposed physically proximate the light emitting layer.

Example 8 may include elements of any of examples 1 through 7 where each of the lower display elements included in the plurality of lower display elements may include: a support layer; a pixel circuit layer disposed physically proximate to the flexible support layer; a light emitting layer conductively coupled to and disposed physically proximate the pixel circuit layer; and a flexible encapsulant disposed physically proximate the light emitting layer.

Example 9 may include elements of any of examples 1 through 8 where the light emitting layer may include at least one of: a plurality of light emitting diodes; a plurality of polymer light emitting diodes (PLEDs); or a plurality of organic light emitting diodes (OLEDs).

Example 10 may include elements of any of examples 1 through 9 where each of the upper display elements included in the plurality of upper display elements may include a first pixel matrix; and where each of the lower display elements included in the plurality of lower display elements comprises a second pixel matrix.

Example 11 may include elements of any of examples 1 through 10 where the first pixel matrix comprises an "$n_1 \times m_1$" rectangular pixel matrix; and where the second pixel matrix comprises an "$n_2 \times m_2$" rectangular pixel matrix.

Example 12 may include elements of any of examples 1 through 11 where the "$n_1 \times m_1$" rectangular pixel matrix has the same pixel row and column count as the "$n_2 \times m_2$" rectangular pixel matrix.

Example 13 may include elements of any of examples 1 through 12 and the expandable display device includes: sensor circuitry to determine a displacement from the first display position; expandable display control circuitry coupled to the sensor circuitry; a storage device that includes machine-executable instructions that, when executed by the expandable display control circuitry, cause the expandable display control circuitry to: deactivate pixels on at least a portion of the lower display elements when the upper display layer is in the first display position; and progressively activate the pixels on exposed portions of at least a portion of the lower display elements as the upper display layer transitions from the first display position to the second display position.

Example 14 may include elements of any of examples 1 through 13 where the sensor circuitry may include at least one of: strain gauge circuitry; stretch sensing circuitry; proximity sensing circuitry; ultrasonic displacement sensing circuitry; or laser displacement sensing circuitry.

Example 15 may include elements of any of examples 1 through 14 where the variable viewing area display device may include a display device continuously displaceable along a first axis.

Example 16 may include elements of any of examples 1 through 15 where the variable viewing area display device comprises a display device continuously displaceable along a first axis and a second axis, the first axis orthogonal to the second axis.

Example 17 may include elements of any of examples 1 through 16 where the upper display elements comprise display elements having a first pixel density; and where the lower display elements comprise display elements having a second pixel density, the second pixel density equal to or greater than the first pixel density.

Example 18 may include elements of any of examples 1 through 17 where, in the first display position, the variable viewing area display device provides an image with a first pixel density; and where in the second display position, the variable viewing area display device provides an image with at least the first pixel density.

According to example 19, there is provided a variable area display method. The method may include: receiving, by expandable display control circuitry, a signal that includes information indicative of a relative position of an upper display layer with respect to a lower display layer; identifying, by the expandable display control circuitry, an exposed portion of each of a plurality of lower display elements based on the relative position of the upper display layer with respect to the lower display layer; determining, by the expandable display control circuitry, a first portion of a display image for display using a plurality of upper display elements included in the upper display layer; and determining, by the expandable display control circuitry, a second portion of a display image for display using the identified exposed portion of each of the lower display elements such that a display image having a uniform pixel density is maintained.

Example 20 may include elements of example 19 where receiving the signal that includes the information indicative of the relative position of the upper display layer with respect to the lower display layer may include: receiving, by the expandable display control circuitry, the signal that includes the information indicative of the relative position, along a single axis, of the upper display layer with respect to the lower display layer.

Example 21 may include elements of any of examples 19 or 20 where receiving the signal that includes the information indicative of the relative position of the upper display layer with respect to the lower display layer may include: receiving, by the expandable display control circuitry, the signal that includes the information indicative of the relative position, along each of two orthogonal axes, of the upper display layer with respect to the lower display layer.

Example 22 may include elements of any of examples 19 through 21, and the method may additionally include: generating, by one or more sensors, the signal that includes information indicative of the relative position of the upper display layer with respect to the lower display layer.

Example 23 may include elements of any of examples 19 through 22 where generating the signal that includes information indicative of the relative position of the upper display layer with respect to the lower display layer may include: generating the signal that includes information indicative of the relative position of the upper display layer with respect to the lower display layer using at least one of: strain gauge circuitry; stretch sensing circuitry; proximity sensing circuitry; ultrasonic displacement sensing circuitry; or laser displacement sensing circuitry.

According to example 24, there is provided a variable area display method. The method may include: pre-straining an upper expandable substrate having an upper surface and a lower expandable substrate having an upper surface; affixing a rear surface of each of a plurality of upper display elements to the upper surface of the upper expandable substrate; each of the plurality of upper display elements spaced apart from at least one other of the plurality of upper display elements to form interstitial spaces separating each of the plurality of upper display elements from each other on the upper expandable substrate; affixing a rear surface each of a plurality of lower display elements to the upper surface of the lower expandable substrate; each of the plurality of lower display elements spaced apart from at least one other of the plurality of lower display elements to form interstitial spaces separating each of the plurality of lower display elements from each other on the lower expandable substrate; removing portions of the upper expandable substrate in the interstitial spaces that separate the plurality of upper display elements; stacking the pre-strained upper expandable substrate on the pre-strained lower expandable substrate; and releasing the strain on the upper expandable substrate and the strain on the lower expandable substrate.

Example 25 may include elements of example 24 and the method may additionally include: detachably attaching each of the plurality of upper display elements to a first rigid support; and detachably attaching each of the plurality of lower display elements to a second rigid support.

Example 26 may include elements of any of examples 24 or 25, and the method may additionally include: depositing an adhesive across at least a portion of the rear surface of the plurality of upper display elements; and depositing an adhesive across at least a portion of the rear surface of the plurality of lower display elements.

Example 27 may include elements of any of examples 24 through 26, and the method may additionally include: activating the upper surface of the upper expandable substrate prior to affixing the rear surface of each of the plurality of upper display elements to the upper surface of the upper expandable substrate; and activating the upper surface of the lower expandable substrate prior to affixing the rear surface of each of the plurality of lower display elements to the upper surface of the lower expandable substrate.

Example 28 may include elements of any of examples 24 through 27 where pre-straining the upper expandable substrate may include: pre-straining at least a portion of an upper expandable substrate that includes at least one elastomeric material; and where pre-straining the lower expandable substrate may include: pre-straining at least a portion of a lower expandable substrate that includes at least one elastomeric material.

According to example 29, there is provided a variable area display system. The system may include: means for receiving a signal that includes information indicative of a relative position of an upper display layer with respect to a lower display layer; means for identifying an exposed portion of each of a plurality of lower display elements based on the relative position of the upper display layer with respect to the lower display layer; means for determining a first portion of a display image for display using a plurality of upper display elements included in the upper display layer; and means for determining a second portion of a display image for display using the identified exposed portion of each of the lower display elements such that a display image having a uniform pixel density is maintained.

Example 30 may include elements of example 29 where the means for receiving the signal that includes the information indicative of the relative position of the upper display layer with respect to the lower display layer may include: means for receiving the signal that includes the information indicative of the relative position, along a single axis, of the upper display layer with respect to the lower display layer.

Example 31 may include elements of any of examples 29 or 30 where the means for receiving the signal that includes the information indicative of the relative position of the upper display layer with respect to the lower display layer may include: means for receiving the signal that includes the information indicative of the relative position, along each of two orthogonal axes, of the upper display layer with respect to the lower display layer.

Example 32 may include elements of any of examples 29 through 31, and the system may additionally include: means for generating the signal that includes information indicative of the relative position of the upper display layer with respect to the lower display layer.

According to example 33, there is provided a non-transitory machine-readable storage medium that includes instructions. The instructions, when executed by expandable display control circuitry, cause the expandable display control circuitry to: receive a signal that includes information indicative of a relative position of an upper display layer with respect to a lower display layer; identify an exposed portion of each of a plurality of lower display elements based on the relative position of the upper display layer with respect to the lower display layer; determine a first portion of a display image for display using a plurality of upper display elements included in the upper display layer; and determine a second portion of a display image for display using the identified exposed portion of each of the lower display elements such that a display image having a uniform pixel density is maintained.

Example 34 may include elements of example 33 where the instructions that cause the expandable display control circuitry to receive a signal that includes information indicative of a relative position of an upper display layer with respect to a lower display layer further cause the expandable display control circuitry to: receive the signal that includes the information indicative of the relative position, along a single axis, of the upper display layer with respect to the lower display layer.

Example 35 may include elements of any of examples 33 or 34 where the instructions that cause the expandable display control circuitry to receive a signal that includes information indicative of a relative position of an upper display layer with respect to a lower display layer further cause the expandable display control circuitry to: receive the signal that includes the information indicative of the relative position, along each of two orthogonal axes, of the upper display layer with respect to the lower display layer.

According to example 36, there is provided an electronic device. The electronic device may include: a printed circuit board; processor circuitry; input/output (I/O) circuitry; and a variable viewing area display device continuously displaceable between a first display position that provides a first display area and a second display position that provides a second display area, the second display area larger than the first display area, the variable viewing area display device comprising: an upper display layer that includes a plurality of upper display elements disposed on an expandable substrate, the expandable substrate continuously displaceable between the first display position and the second display position; a lower display layer that includes a plurality of lower display elements disposed on an expandable substrate, the expandable substrate continuously displaceable between the first display position and the second display position wherein: in the first display position the plurality of upper display elements obscure at least a portion of the plurality of lower display elements; as the display device is displaced from the first position to the second position, at least a portion of each of the plurality of lower display elements are visible through void spaces formed in the expandable substrate of the upper display layer between each of at least some of the plurality of upper display elements; and in the second position each of the plurality of lower display elements are visible through the void spaces formed in the expandable substrate of the upper display layer between each of at least some of the plurality of upper display elements.

Example 37 may include elements of example 36 and the device may additionally include: a plurality of upper flexible interconnects, each of the plurality of upper flexible interconnects conductively coupling each of the plurality of upper display elements to at least one other of the upper display elements included in the plurality of upper display elements; and a plurality of lower flexible interconnects, each of the plurality of lower flexible interconnects conductively coupling each of the plurality of upper display elements to at least one other of the lower display elements included in the plurality of upper display elements.

Example 38 may include elements of example 36 and 37 where each of the first plurality of flexible interconnects comprises at least one conductive layer disposed at least partially surrounded by a flexible dielectric material; and where at least a portion of the flexible interconnects included in the first plurality of flexible interconnects are biased toward the first display position.

Example 39 may include elements of any of examples 36 through 38 where each of the second plurality of flexible interconnects comprises at least one conductive layer at least partially surrounded by a flexible dielectric material; and where at least a portion of the flexible interconnects included in the second plurality of flexible interconnects are biased toward the first display position.

Example 40 may include elements of any of examples 36 through 39 where, in the first display position, the upper display elements are separated from at least one other of the upper display elements by a first distance of less than about 2 millimeters (mm).

Example 41 may include elements of any of examples 36 through 40 where, in the first display position, the lower display elements are separated from at least one other of the lower display elements by a first distance of less than about 2 millimeters (mm).

Example 42 may include elements of any of examples 36 through 41 where each of the upper display elements included in the plurality of upper display elements may include: a flexible support layer; a pixel circuit layer disposed physically proximate to the flexible support layer; a light emitting layer conductively coupled to and disposed physically proximate the pixel circuit layer; and a flexible encapsulant disposed physically proximate the light emitting layer.

Example 43 may include elements of any of examples 36 through 42 where each of the lower display elements included in the plurality of lower display elements may include: a flexible support layer; a pixel circuit layer disposed physically proximate to the flexible support layer; a light emitting layer conductively coupled to and disposed physically proximate the pixel circuit layer; and a flexible encapsulant disposed physically proximate the light emitting layer.

Example 44 may include elements of any of examples 36 through 43 where the light emitting layer comprises at least one of: a plurality of light emitting diodes; a plurality of polymer light emitting diodes (PLEDs); or a plurality of organic light emitting diodes (OLEDs).

Example 45 may include elements of any of examples 36 through 44 where each of the upper display elements included in the plurality of upper display elements comprises a first pixel matrix; and where each of the lower display elements included in the plurality of lower display elements comprises a second pixel matrix.

Example 46 may include elements of any of examples 36 through 45 where the first pixel matrix comprises an "$n_1 \times m_1$" rectangular pixel matrix; and where the second pixel matrix comprises an "$n_2 \times m_2$" rectangular pixel matrix.

Example 47 may include elements of any of examples 36 through 46 where the "$n_1 \times m_1$" rectangular pixel matrix has the same pixel row and column count as the "$n_2 \times m_2$" rectangular pixel matrix.

Example 48 may include elements of any of examples 36 through 47, and the electronic device may additionally include: sensor circuitry to determine a displacement from the first display position; expandable display control circuitry coupled to the sensor circuitry; a storage device that includes machine-executable instructions that, when executed by the expandable display control circuitry, cause the expandable display control circuitry to: deactivate pixels on at least a portion of the lower display elements when the upper display layer is in the first display position; and progressively activate the pixels on exposed portions of at least a portion of the lower display elements as the upper display layer transitions from the first display position to the second display position.

Example 49 may include elements of any of examples 36 through 48 where the sensor circuitry includes at least one of: strain gauge circuitry; stretch sensing circuitry; proximity sensing circuitry; ultrasonic displacement sensing circuitry; or laser displacement sensing circuitry.

Example 50 may include elements of any of examples 36 through 49 where the variable viewing area display device comprises a display device continuously displaceable along a first axis.

Example 51 may include elements of any of examples 36 through 50 where the variable viewing area display device comprises a display device continuously displaceable along a first axis and a second axis, the first axis orthogonal to the second axis.

Example 52 may include elements of any of examples 36 through 51 where the upper display elements comprise display elements having a first pixel density; and where the lower display elements comprise display elements having a second pixel density, the second pixel density equal to or greater than the first pixel density.

Example 53 may include elements of any of examples 36 through 52 where, in the first display position, the variable viewing area display device provides an image with a first pixel density; and where, in the second display position, the variable viewing area display device provides an image with at least the first pixel density.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

What is claimed:

1. A variable viewing area display device continuously displaceable between a first display position that provides a first display area and a second display position that provides a second display area, the second display area larger than the first display area, the display device comprising:
    an upper display layer that includes a plurality of upper display elements disposed on an expandable substrate, the expandable substrate continuously displaceable between the first display position and the second display position
    a lower display layer that includes a plurality of lower display elements disposed on an expandable substrate, the expandable substrate continuously displaceable between the first display position and the second display position wherein:
        in the first display position the plurality of upper display elements obscure at least a portion of the plurality of lower display elements;
        as the display device is displaced from the first position to the second position, at least a portion of each of the plurality of lower display elements are visible through void spaces formed in the expandable substrate of the upper display layer between each of at least some of the plurality of upper display elements; and
        in the second position each of the plurality of lower display elements are visible through the void spaces formed in the expandable substrate of the upper display layer between each of at least some of the plurality of upper display elements.

2. The variable viewing area display device of claim 1, further comprising:
    a plurality of upper flexible interconnects, each of the plurality of upper flexible interconnects conductively coupling each of the plurality of upper display elements to at least one other of the upper display elements included in the plurality of upper display elements; and
    a plurality of lower flexible interconnects, each of the plurality of lower flexible interconnects conductively coupling each of the plurality of upper display elements to at least one other of the lower display elements included in the plurality of upper display elements.

3. The variable viewing area display device of claim 1:
    wherein each of the first plurality of flexible interconnects comprises at least one conductive layer disposed at least partially surrounded by a flexible dielectric material; and wherein at least a portion of the flexible interconnects included in the first plurality of flexible interconnects are biased toward the first display position.

4. The variable viewing area display device of claim 3:
wherein each of the second plurality of flexible interconnects comprises at least one conductive layer at least partially surrounded by a flexible dielectric material; and
wherein at least a portion of the flexible interconnects included in the second plurality of flexible interconnects are biased toward the first display position.

5. The variable viewing area display device of claim 1:
wherein, in the first display position, the upper display elements are separated from at least one other of the upper display elements by a first distance of less than about 2 millimeters (mm).

6. The variable viewing area display device of claim 1:
wherein, in the first display position, the lower display elements are separated from at least one other of the lower display elements by a first distance of less than about 2 millimeters (mm).

7. The variable viewing area display device of claim 1 wherein each of the upper display elements included in the plurality of upper display elements comprises:
a flexible support layer;
a pixel circuit layer disposed physically proximate to the flexible support layer;
a light emitting layer conductively coupled to and disposed physically proximate the pixel circuit layer; and
a flexible encapsulant disposed physically proximate the light emitting layer.

8. The variable viewing area display device of claim 7 wherein each of the lower display elements included in the plurality of lower display elements comprises:
a flexible support layer;
a pixel circuit layer disposed physically proximate to the flexible support layer;
a light emitting layer conductively coupled to and disposed physically proximate the pixel circuit layer; and
a flexible encapsulant disposed physically proximate the light emitting layer.

9. The variable viewing area display device of claim 7 wherein the light emitting layer comprises at least one of: a plurality of light emitting diodes; a plurality of polymer light emitting diodes (PLEDs); or a plurality of organic light emitting diodes (OLEDs).

10. The variable viewing area display device of claim 1:
wherein each of the upper display elements included in the plurality of upper display elements comprises a first pixel matrix; and
wherein each of the lower display elements included in the plurality of lower display elements comprises a second pixel matrix.

11. The variable viewing area display device of claim 10:
wherein the first pixel matrix comprises an "$n_1 \times m_1$" rectangular pixel matrix; and
wherein the second pixel matrix comprises an "$n_2 \times m_2$" rectangular pixel matrix.

12. The variable viewing area display device of claim 11 wherein the "$n_1 \times m_1$" rectangular pixel matrix has the same pixel row and column count as the "$n_2 \times m_2$" rectangular pixel matrix.

13. The variable viewing area display device of claim 10, further comprising:
sensor circuitry to determine a displacement from the first display position;
expandable display control circuitry coupled to the sensor circuitry;
a storage device that includes machine-executable instructions that, when executed by the expandable display control circuitry, cause the expandable display control circuitry to:
deactivate pixels on at least a portion of the lower display elements when the upper display layer is in the first display position; and
progressively activate the pixels on exposed portions of at least a portion of the lower display elements as the upper display layer transitions from the first display position to the second display position.

14. The variable viewing area display device of claim 13 wherein the sensor circuitry includes at least one of: strain gauge circuitry; stretch sensing circuitry; proximity sensing circuitry; ultrasonic displacement sensing circuitry; or laser displacement sensing circuitry.

15. The variable viewing area display device of claim 1 wherein the variable viewing area display device comprises a display device continuously displaceable along a first axis.

16. The variable viewing area display device of claim 1 wherein the variable viewing area display device comprises a display device continuously displaceable along a first axis and a second axis, the first axis orthogonal to the second axis.

17. The variable viewing area display device of claim 1:
wherein the upper display elements comprise display elements having a first pixel density; and
wherein the lower display elements comprise display elements having a second pixel density, the second pixel density equal to or greater than the first pixel density.

18. The variable viewing area display device of claim 1:
wherein, in the first display position, the variable viewing area display device provides an image with a first pixel density; and
wherein, in the second display position, the variable viewing area display device provides an image with at least the first pixel density.

19. A variable area display method, comprising:
receiving, by expandable display control circuitry, a signal that includes information indicative of a relative position of an upper display layer with respect to a lower display layer;
identifying, by the expandable display control circuitry, an exposed portion of each of a plurality of lower display elements based on the relative position of the upper display layer with respect to the lower display layer;
determining, by the expandable display control circuitry, a first portion of a display image for display using a plurality of upper display elements included in the upper display layer; and
determining, by the expandable display control circuitry, a second portion of a display image for display using the identified exposed portion of each of the lower display elements such that a display image having a uniform pixel density is maintained.

20. The variable area display method of claim 19 wherein receiving the signal that includes the information indicative of the relative position of the upper display layer with respect to the lower display layer comprises:
receiving, by the expandable display control circuitry, the signal that includes the information indicative of the relative position, along a single axis, of the upper display layer with respect to the lower display layer.

21. The variable area display method of claim 19 wherein receiving the signal that includes the information indicative of the relative position of the upper display layer with respect to the lower display layer comprises:
  receiving, by the expandable display control circuitry, the signal that includes the information indicative of the relative position, along each of two orthogonal axes, of the upper display layer with respect to the lower display layer.

22. The variable area display method of claim 19, further comprising:
  generating, by one or more sensors, the signal that includes information indicative of the relative position of the upper display layer with respect to the lower display layer.

23. The variable area display method of claim 22 wherein generating the signal that includes information indicative of the relative position of the upper display layer with respect to the lower display layer comprises:
  generating the signal that includes information indicative of the relative position of the upper display layer with respect to the lower display layer using at least one of: strain gauge circuitry; stretch sensing circuitry; proximity sensing circuitry; ultrasonic displacement sensing circuitry; or laser displacement sensing circuitry.

24. A variable area display method, comprising:
  pre-straining an upper expandable substrate having an upper surface and a lower expandable substrate having an upper surface;
  affixing a rear surface of each of a plurality of upper display elements to the upper surface of the upper expandable substrate;
    each of the plurality of upper display elements spaced apart from at least one other of the plurality of upper display elements to form interstitial spaces separating each of the plurality of upper display elements from each other on the upper expandable substrate;
  affixing a rear surface each of a plurality of lower display elements to the upper surface of the lower expandable substrate;
    each of the plurality of lower display elements spaced apart from at least one other of the plurality of lower display elements to form interstitial spaces separating each of the plurality of lower display elements from each other on the lower expandable substrate;
  removing portions of the upper expandable substrate in the interstitial spaces that separate the plurality of upper display elements;
  stacking the pre-strained upper expandable substrate on the pre-strained lower expandable substrate; and
  releasing the strain on the upper expandable substrate and the strain on the lower expandable substrate.

25. A variable area display system, comprising:
  means for receiving a signal that includes information indicative of a relative position of an upper display layer with respect to a lower display layer;
  means for identifying an exposed portion of each of a plurality of lower display elements based on the relative position of the upper display layer with respect to the lower display layer;
  means for determining a first portion of a display image for display using a plurality of upper display elements included in the upper display layer; and
  means for determining a second portion of a display image for display using the identified exposed portion of each of the lower display elements such that a display image having a uniform pixel density is maintained.

* * * * *